US011195844B2

(12) United States Patent
Ota et al.

(10) Patent No.: US 11,195,844 B2
(45) Date of Patent: Dec. 7, 2021

(54) SEMICONDUCTOR MEMORY DEVICE AND METHOD OF MANUFACTURING THE SAME

(71) Applicant: Kioxia Corporation, Minato-ku (JP)

(72) Inventors: Kensuke Ota, Yokohama (JP); Masumi Saitoh, Yokohama (JP); Kiwamu Sakuma, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 141 days.

(21) Appl. No.: 16/804,403

(22) Filed: Feb. 28, 2020

(65) Prior Publication Data
US 2021/0066316 A1 Mar. 4, 2021

(30) Foreign Application Priority Data

Sep. 4, 2019 (JP) .............................. JP2019-160949

(51) Int. Cl.
| | | |
|---|---|---|
| *H01L 27/1157* | (2017.01) | |
| *H01L 27/11565* | (2017.01) | |
| *H01L 27/11573* | (2017.01) | |
| *H01L 27/11529* | (2017.01) | |
| *H01L 27/11524* | (2017.01) | |
| *H01L 27/11539* | (2017.01) | |
| *H01L 27/11519* | (2017.01) | |

(52) U.S. Cl.
CPC .... *H01L 27/1157* (2013.01); *H01L 27/11519* (2013.01); *H01L 27/11524* (2013.01); *H01L 27/11529* (2013.01); *H01L 27/11539* (2013.01); *H01L 27/11565* (2013.01); *H01L 27/11573* (2013.01)

(58) Field of Classification Search
CPC ........... H01L 27/1157; H01L 27/11565; H01L 27/11573; H01L 27/11529; H01L 27/11524; H01L 27/11539; H01L 27/11519; H01L 27/11556; H01L 27/11582
See application file for complete search history.

(56) References Cited

U.S. PATENT DOCUMENTS

| | | |
|---|---|---|
| 8,283,717 B2 | 10/2012 | Matsunami et al. |
| 9,070,442 B2 | 6/2015 | Yip et al. |
| (Continued) | | |

FOREIGN PATENT DOCUMENTS

| | | |
|---|---|---|
| JP | 2011-100946 A | 5/2011 |
| JP | 2017-59607 A | 3/2017 |
| JP | 2017-195275 A | 10/2017 |

*Primary Examiner* — Allison Bernstein
(74) *Attorney, Agent, or Firm* — Oblon, McClelland, Maier & Neustadt, L.L.P.

(57) ABSTRACT

A semiconductor memory device includes a substrate, a plurality of conductive layers, a first semiconductor layer, a memory portion, and a drive circuit which drives the memory cell. The conductive layers are provided in a first region, a second region, and a third region different from the first region and the second region, and a portion positioned in the third region is insulated from a portion positioned in the first region and the second region. The drive circuit is provided in the third region, and includes a second semiconductor layer, and an insulating layer, and one end of the second semiconductor layer is connected to the conductive layers in the second region and the other end of the second semiconductor layer is connected to the substrate.

20 Claims, 28 Drawing Sheets

(56) References Cited

U.S. PATENT DOCUMENTS

| | | | |
|---|---|---|---|
| 9,224,747 B2 * | 12/2015 | Mizutani | H01L 27/11582 |
| 9,818,757 B2 | 11/2017 | Ikeda et al. | |
| 10,134,749 B2 | 11/2018 | Noguchi et al. | |
| 2016/0260722 A1 | 9/2016 | Baba et al. | |

* cited by examiner

SEMICONDUCTOR MEMORY DEVICE AND METHOD OF MANUFACTURING THE SAME

CROSS-REFERENCE TO RELATED APPLICATIONS

This application is based upon and claims the benefit of Japanese Patent Application No. 2019-160949, filed on Sep. 4, 2019, the entire contents of which are incorporated herein by reference.

BACKGROUND

Field

Embodiments described below relate to a semiconductor memory device and a method of manufacturing the same.

Description of the Related Art

A semiconductor memory device which includes a substrate, a plurality of conductive layers which are disposed in a first direction intersecting a surface of the substrate and extend in a second direction intersecting the first direction, a plurality of insulating layers which are provided between the plurality of conductive layers, a semiconductor layer which extends in the first direction and faces the plurality of conductive layers and the plurality of insulating layers in the second direction, and a gate insulating film which is provided between the plurality of conductive layers and the semiconductor layer has been known.

DETAILED DESCRIPTION

Figure 1:
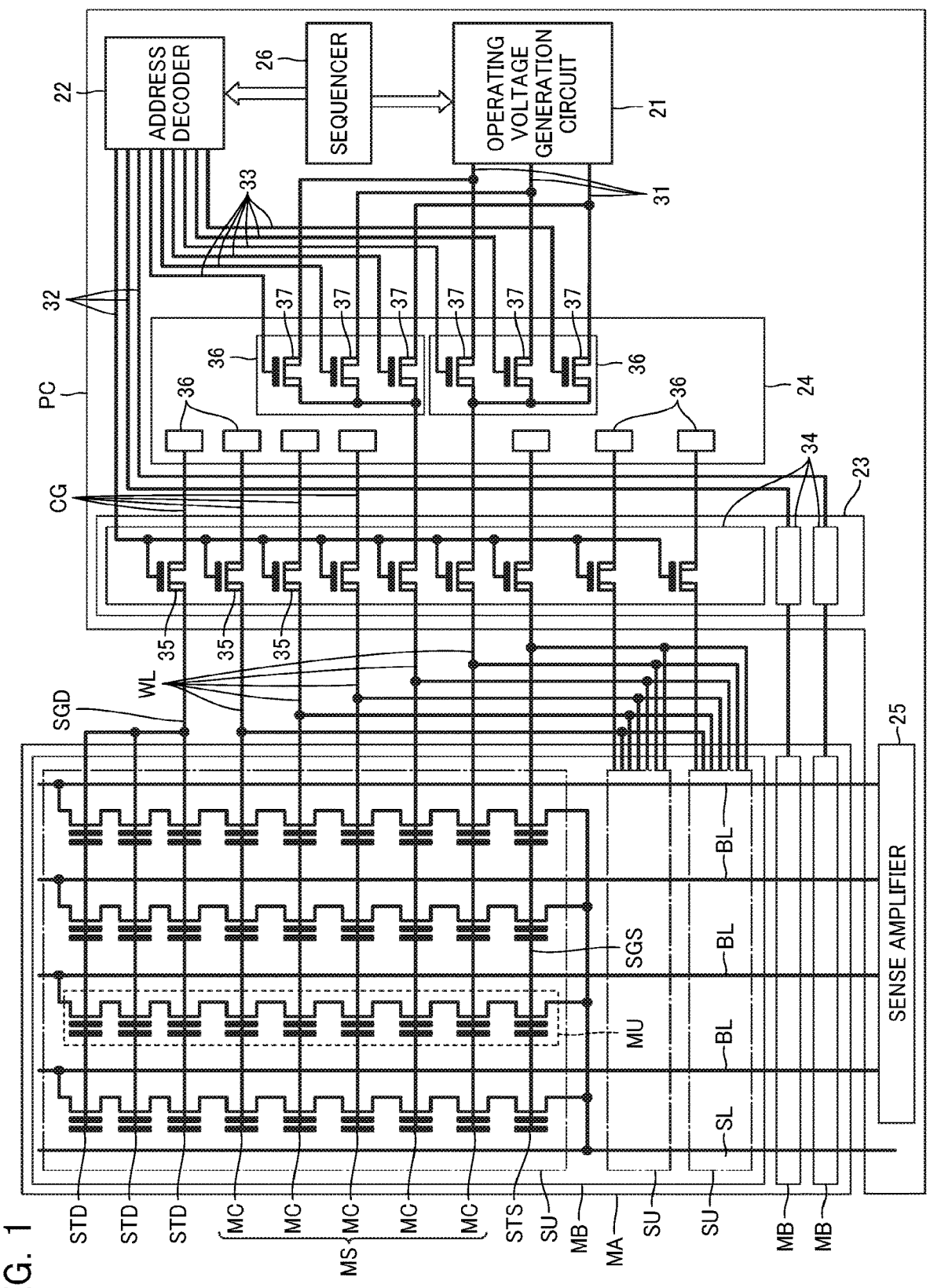
FIG. 1 is an equivalent circuit diagram illustrating a schematic configuration of a semiconductor memory device according to a first embodiment.

A semiconductor memory device according to an embodiment includes a substrate; a plurality of conductive layers which are disposed in a first direction intersecting the substrate and extend in a second direction intersecting the first direction; a first semiconductor layer which extends in the first direction and faces the plurality of conductive layers; a memory portion which is provided between the first semiconductor layer and the plurality of conductive layers; and a drive circuit which drives the memory cell. The plurality of conductive layers are provided in a first region where a plurality of the memory cells are disposed, a second region provided closer to an end portion of the plurality of conductive layers than the first region in the second direction, and a third region different from the first region and the second region, and a portion positioned in the third region of the plurality of conductive layers is insulated from portions positioned in the first region and the second region of the plurality of conductive layers. The drive circuit is provided in the third region, and includes a second semiconductor layer which extends through the plurality of conductive layers in the first direction, and an insulating layer provided between the second semiconductor layer and the plurality of conductive layers, and one end of the second semiconductor layer is connected to the plurality of conductive layers in the second region through a wiring and the other end of the second semiconductor layer is connected to the substrate.

A semiconductor memory device according to another embodiment includes a substrate; a plurality of conductive layers which are disposed in a first direction intersecting the substrate and extend in a second direction intersecting the first direction; a first structure which extends in the first direction and faces the plurality of conductive layers; and a second structure which extends in the first direction and faces the plurality of conductive layers. The plurality of conductive layers include a first region where the first structure is disposed, a second region provided closer to an end portion of the plurality of conductive layers than the first region in the second direction, and a third region which is insulated from the first region and the second region and where the second structure is disposed. The first structure includes a first semiconductor layer which extends in the first direction and faces the plurality of conductive layers, a memory portion which is provided between the first semiconductor layer and the plurality of conductive layers. The second structure includes a second semiconductor layer which extends in the first direction and faces the plurality of conductive layers, and an insulating layer provided between the second semiconductor layer and the plurality of conductive layers. One end of the second structure is connected to the plurality of conductive layers in the second region through a wiring and another the other end of the second structure is connected to a circuit formed on the substrate.

A method of manufacturing a semiconductor memory device according to an embodiment includes forming a stacked body by alternately stacking, in a first direction intersecting a surface of a substrate, a plurality of sacrificial layers and a plurality of first insulating layers which extend in a second direction intersecting the first direction; among a first region, a second region, and a third region of the stacked body, forming a step portion in the second region, the second region being positioned closer to an end portion of the stacked body than the first region in the second direction, the third region being different from the first region and the second region; forming, in the first region, a memory portion and a first semiconductor layer extending in the first direction and facing the plurality of sacrificial layers and the plurality of first insulating layers; forming, in the third region, a second insulating layer and a second semiconductor layer extending in the first direction and facing the plurality of sacrificial layers and the plurality of first insulating layers; forming a groove which separates the third region from the first region and the second region and extends in the first direction; forming a cavity by removing the sacrificial layers through the groove; forming a conductive layer in the cavity; and forming a third insulating layer in the groove to insulate the third region from the first region and the second region.

Next, semiconductor memory devices and methods of manufacturing the same according to embodiments will be described in detail with reference to the drawings. The following embodiments are merely examples, and are not intended to limit the present invention. Further, the following drawings are schematic, and some configurations and the like may be omitted for convenience of description. In addition, common parts in a plurality of embodiments are given the same reference numerals, and description thereof may be omitted.

In this specification, a direction intersecting the surface of the substrate is referred to as a first direction, a direction intersecting the first direction is referred to as a second direction, and a direction intersecting the first direction and the second direction is referred to as a third direction. A predetermined direction parallel to the surface of the substrate is referred to as an X direction, a direction which is parallel to the surface of the substrate and is perpendicular to the X direction is referred to as a Y direction, and a direction perpendicular to the surface of the substrate is referred to as a Z direction. In the following description, a case where the X direction, the Y direction, and the Z direction respectively correspond to the second direction, the third direction, and the first direction will be exemplified. However, the first direction, the second direction, and the third direction are not limited to the Z direction, the X direction, and the Y direction.

In this specification, expressions such as "up" and "down" are based on a substrate. For example, a direction away from the substrate along the first direction is referred to as "up", and a direction approaching the substrate along the first direction is referred to as "down". Further, a case of referring to a lower surface or a lower end of a certain configuration means a surface or an end on the substrate side of this configuration, and a case of referring to an upper surface or an upper end means a surface or an end on a side opposite to the substrate of this configuration. Further, a surface that intersects the second direction or the third direction is referred to as a side surface.

In this specification, a "semiconductor memory device" has various meanings such as a memory die, a memory system which includes a control die such as, a memory chip, a memory card, and an SSD, and a configuration including a host computer, such as a smartphone, a tablet terminal, or a personal computer.

Further, in this specification, the term "electrically connected" between a first structure and a second structure means that the first structure is directly connected to the second structure or the first structure is connected to the second structure through a circuit such as a wiring, a semiconductor member, or a transistor. For example, in a case where three transistors are connected in series, the first transistor is "electrically connected" to the third transistor even if the second transistor is in an OFF state.

First Embodiment

[Configuration]

Hereinafter, the configuration of a semiconductor memory device according to a first embodiment will be described with reference to the drawings.

FIG. 1 is a schematic equivalent circuit diagram illustrating the configuration of the semiconductor memory device according to the first embodiment.

The semiconductor memory device according to the present embodiment includes a memory cell array MA, and a peripheral circuit PC as a control circuit for controlling the memory cell array MA.

The memory cell array MA includes a plurality of memory blocks MB. Each of the plurality of memory blocks MB includes a plurality of string units SU. Each of the plurality of string units SU includes a plurality of memory units MU. One end of each of the plurality of memory units MU is connected to the peripheral circuit PC through a bit line BL. The other end of each of the plurality of memory units MU is connected to the peripheral circuit PC through a common source line SL.

The memory unit MU includes one or a plurality of drain selection transistors STD, a plurality of memory cells MC (memory strings MS), and a source selection transistor STS which are connected in series between the bit line BL and the source line SL. Hereinafter, the drain selection transistor STD and the source selection transistor STS may be simply referred to as selection transistors (STD, STS) and the like.

The memory cell MC is a field-effect transistor (memory transistor) including a semiconductor layer, a gate insulating film, and a gate electrode. The semiconductor layer functions as a channel region. The gate insulating film includes a memory portion that can store data. This memory portion is a charge storage film such as a silicon nitride film (SiN) or a floating gate. The threshold voltage of the memory cell MC changes according to the amount of charge in the charge storage film. Note that word lines WL are connected to gate electrodes of a plurality of memory cells MC corresponding to one memory string MS, respectively. These word lines WL are commonly connected to all of the memory strings MS in one memory block MB.

The selection transistor (STD, STS) is a field-effect transistor which includes a semiconductor layer functioning as a channel region, a gate insulating film, and a gate electrode. In this example, three drain selection transistors STD connected in series in one memory unit MU are provided, but the number of selection transistors STD and STS in one memory unit MU is freely selected. Selection gate lines (SGD, SGS) are connected to the gate electrodes of the selection transistors (STD, STS), respectively. The drain selection gate line SGD is provided to correspond to the string unit SU, and is commonly connected to all of the memory units MU in one string unit SU. The source selection gate line SGS is commonly connected to all of the memory units MU in the plurality of string units SU in one memory block MB.

The peripheral circuit PC includes an operating voltage generation circuit 21 that generates an operating voltage, an address decoder 22 that decodes address data, a block selection circuit 23 and a voltage selection circuit 24 which transfer an operating voltage to the memory cell array MA according to an output signal from the address decoder 22, a sense amplifier 25 connected to the bit line BL, and a sequencer 26 for controlling these.

The operating voltage generation circuit 21 sequentially generates a plurality of operating voltages applied to the bit line BL, the source line SL, the word line WL, and the selection gate line (SGD, SGS) during a read operation, a write operation, and an erase operation to the memory cell array MA according to the control signal from the sequencer 26, and outputs the operating voltages to a plurality of operating voltage output terminals 31. The operating voltage generation circuit 21 includes, for example, a plurality of charge pump circuits and a plurality of regulator circuits.

The address decoder 22 includes a plurality of block selection lines 32 and a plurality of voltage selection lines 33. For example, the address decoder 22 refers to the address data of the sequential address register according to the control signal from the sequencer 26, decodes the address data, and sets the predetermined block selection line 32 and voltage selection line 33 corresponding to the address data to the "H" state and other block selection lines 32 and voltage selection lines 33 to the "L" state.

The block selection circuit 23 includes a plurality of block selection units 34 corresponding to the memory blocks MB. Each of the plurality of block selection units 34 includes a plurality of block selection transistors 35 corresponding to the word line WL and the selection gate line (SGD, SGS). The block selection transistor 35 has a function as a drive transistor for driving the memory cell MC and the selection transistors STD and STS, and is, for example, a field-effect type withstand voltage transistor. One end of each of the block selection transistors 35 is electrically connected to the corresponding word line WL or the corresponding selection gate line (SGD, SGS). The other end of each of the block selection transistors 35 is electrically connected to the operating voltage output terminal 31 through a wiring CG and the voltage selection circuit 24. The gate electrodes of the block selection transistors 35 are commonly connected to the corresponding block selection line 32.

The voltage selection circuit 24 includes a plurality of voltage selection units 36 corresponding to the word line WL and the selection gate line (SGD, SGS). Each of the plurality of voltage selection units 36 includes a plurality of voltage selection transistors 37. The voltage selection transistor 37 is, for example, a field effect type withstand voltage transistor. One end of each of the voltage selection transistors 37 is electrically connected to the corresponding word line WL or the corresponding selection gate line (SGD, SGS) through the wiring CG and the block selection circuit 23. The other end of each of the voltage selection transistors 37 is electrically connected to the corresponding operating voltage output terminal 31. Each of the gate electrodes of the voltage selection transistors 37 is connected to the corresponding voltage selection line 33.

The sense amplifier 25 is connected to a plurality of bit lines BL. The sense amplifier 25 includes, for example, a plurality of sense amplifier units corresponding to the bit lines BL. Each of the sense amplifier units includes a clamp transistor that charges the bit line BL based on the voltage generated by the operating voltage generation circuit 21, a sense circuit that senses the voltage or current of the bit line BL, a plurality of latches for holding an output signal of the sense circuit, write data, verify pass flags FLG, and the like, and a logic circuit. For example, at the time of a read operation, the logic circuit specifies the data held in the memory cell MC by referring to the data of the lower page held in the latch. Further, for example, at the time of a write operation, the voltage of the bit line BL is controlled with reference to the data of the lower page held in the latch.

The sequencer 26 outputs a control signal to the operating voltage generation circuit 21, the address decoder 22, and the sense amplifier 25 according to the input command and the state of the semiconductor memory device. For example, the sequencer 26 refers to the command data of the sequential command register according to the clock signal, decodes the command data, and outputs the command data to the operating voltage generation circuit 21, the address decoder 22, and the sense amplifier 25.

Figure 2:
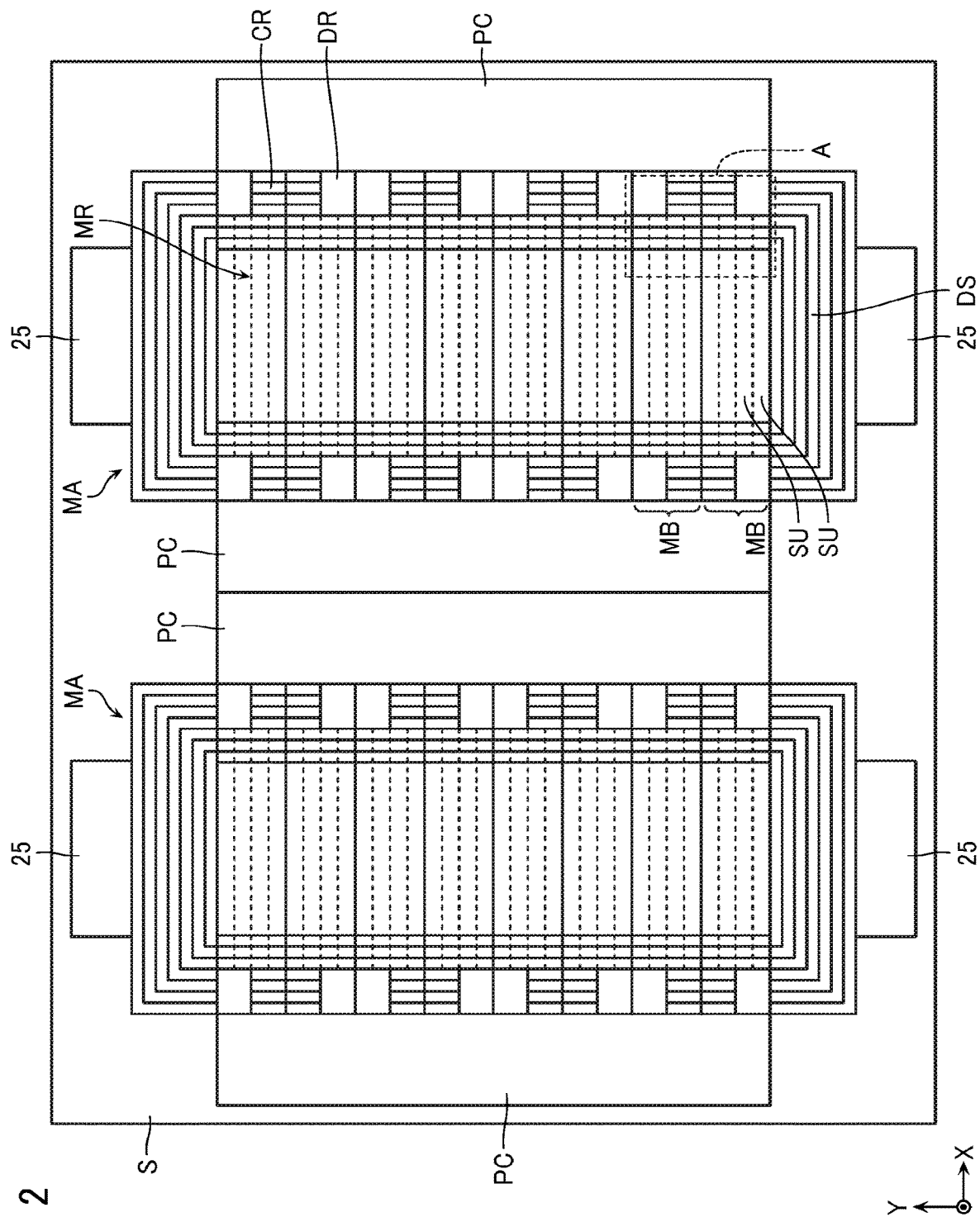
FIG. 2 is a schematic plan view of the semiconductor memory device.

FIG. 2 is a plan view illustrating the overall layout of the semiconductor memory device according to the present embodiment as viewed from above in the Z direction.

As illustrated in FIG. 2, a plurality of memory cell arrays MA and a peripheral circuit PC are provided on a substrate S. In the illustrated example, two memory cell arrays MA are provided on the substrate S side by side in the X direction. The memory cell array MA includes a plurality of memory blocks MB arranged in the Y direction. Each of the plurality of memory blocks MB includes a plurality of string units SU arranged in the Y direction.

The memory cell array MA includes a memory region MR (first region) in which memory cells MC are provided, and contact regions CR (second regions) disposed on both sides of the memory region MR in the X direction. The peripheral circuits PC are disposed on both sides of the memory cell array MA in the X direction. Further, a drive circuit region DR (third region) is provided so as to enter the contact region CR. The drive circuit region DR is adjacent to a part of the contact region CR in the Y direction, and is insulated and separated from the memory region MR and the contact region CR. In the drive circuit region DR, a plurality of word line drive transistors constituting a part of the peripheral circuit PC are disposed. The sense amplifiers 25 as a part of the peripheral circuit PC are disposed on both sides of the memory region MR in the Y direction through dummy step portions DS.

Figure 3:
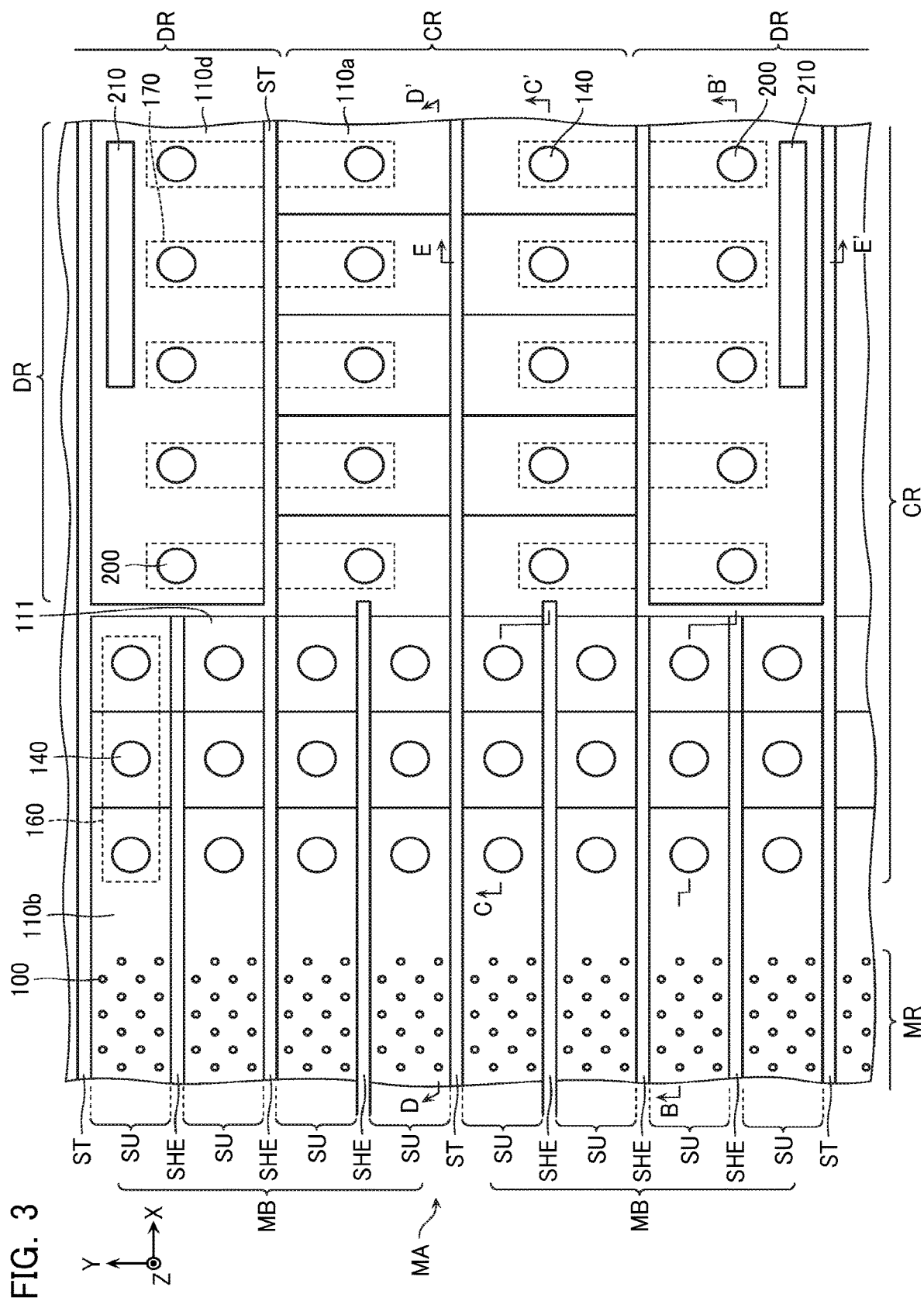
FIG. 3 is an enlarged view of a portion A in FIG. 2.
Figure 4:
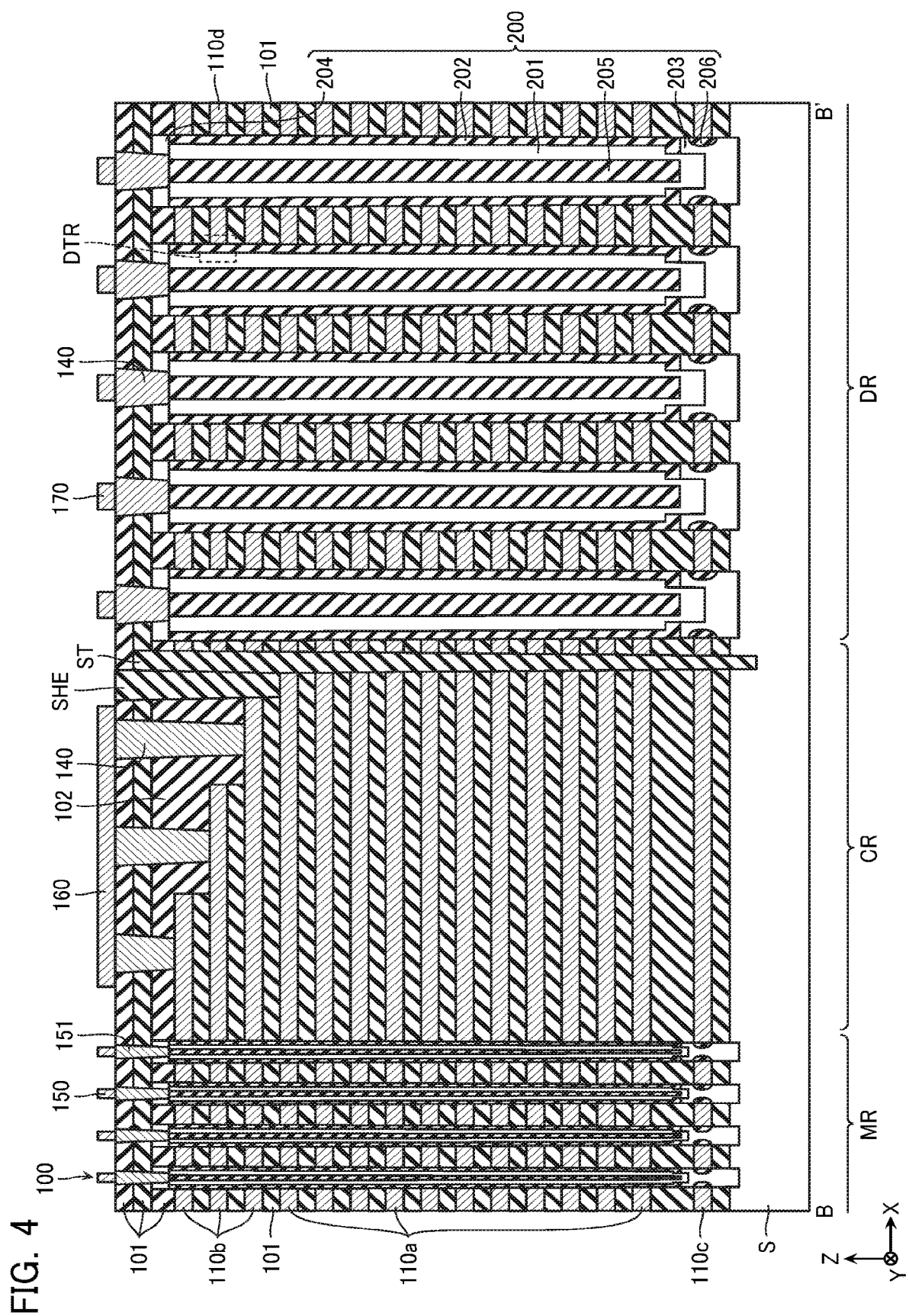
FIG. 4 is a schematic cross-sectional view taken along line B-B' in FIG. 3 and viewed in a direction of an arrow.
Figure 5:
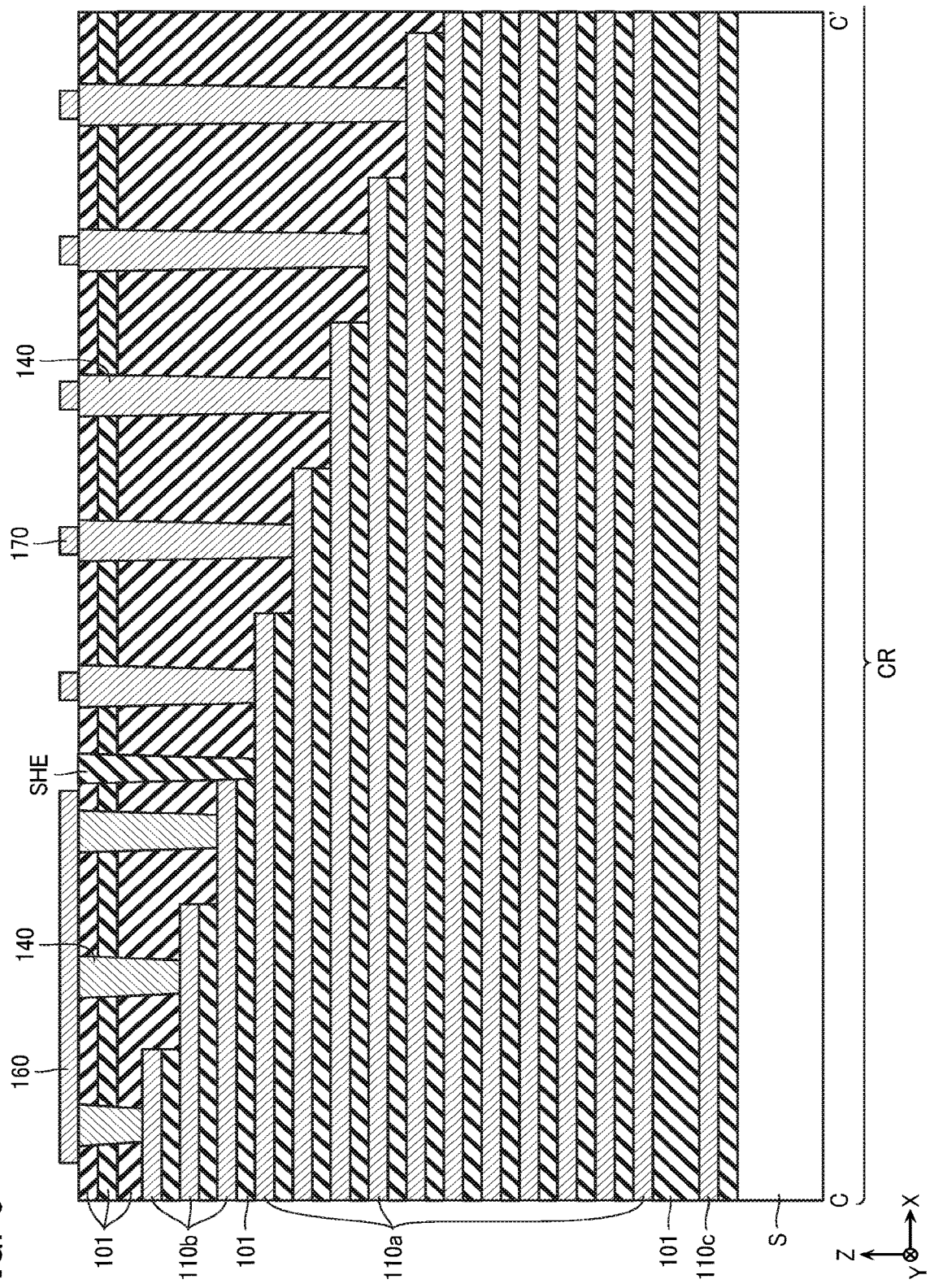
FIG. 5 is a schematic cross-sectional view taken along line C-C' in FIG. 3 and viewed in a direction of an arrow.
Figure 6:
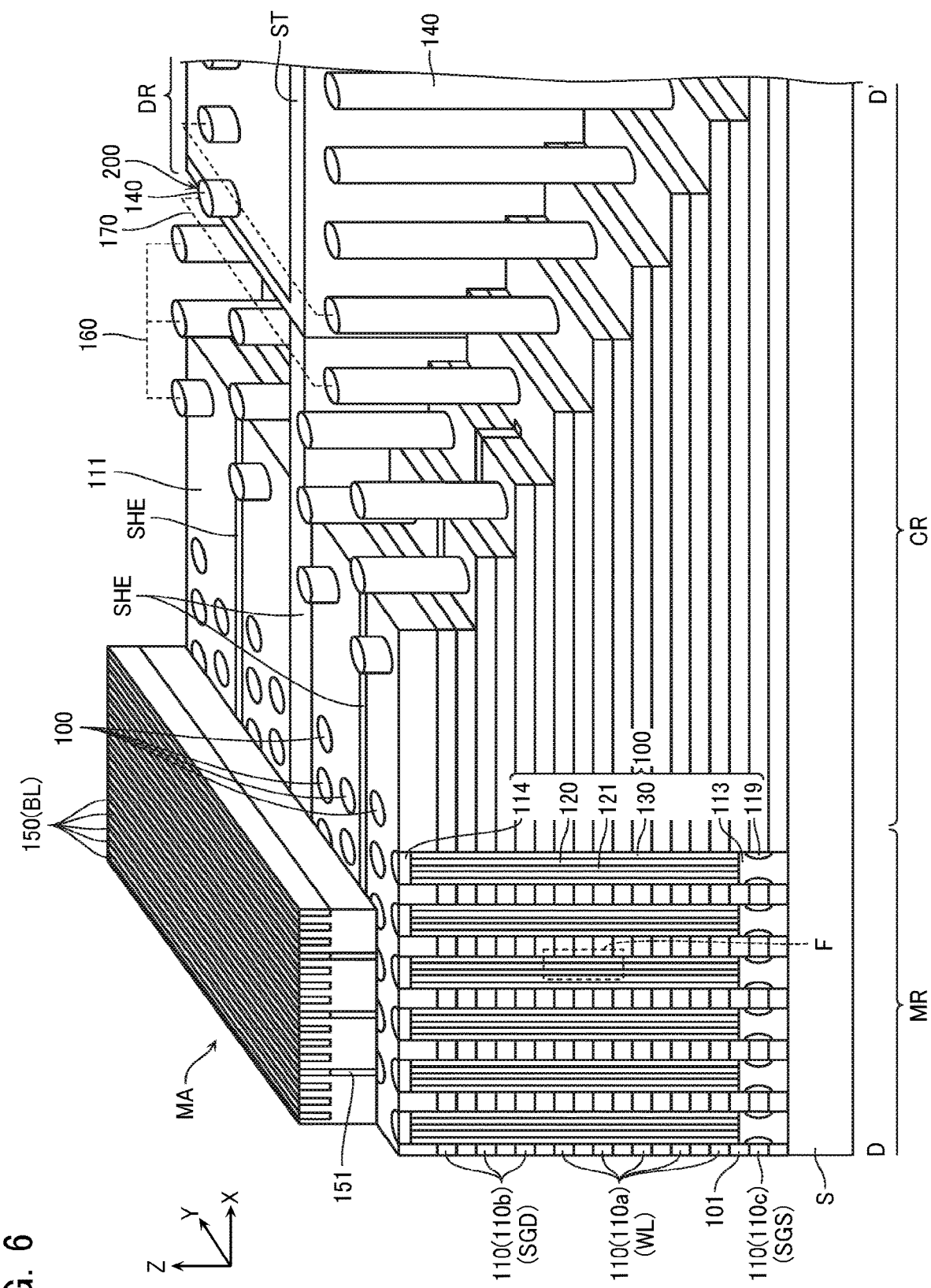
FIG. 6 is a schematic perspective view taken along line D-D' in FIG. 3 and viewed in a direction of an arrow.
Figure 7:
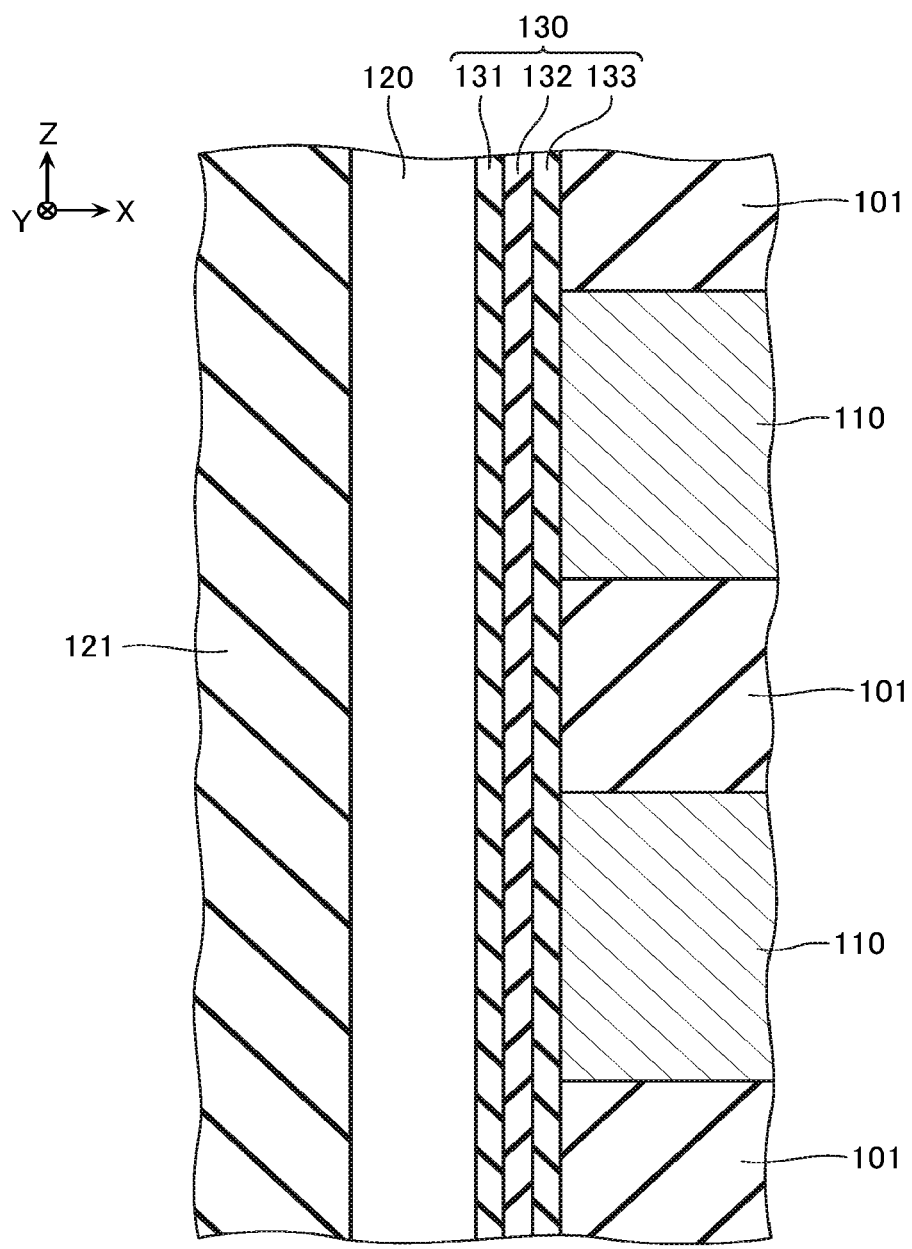
FIG. 7 is an enlarged view of a portion F in FIG. 6.
Figure 8:
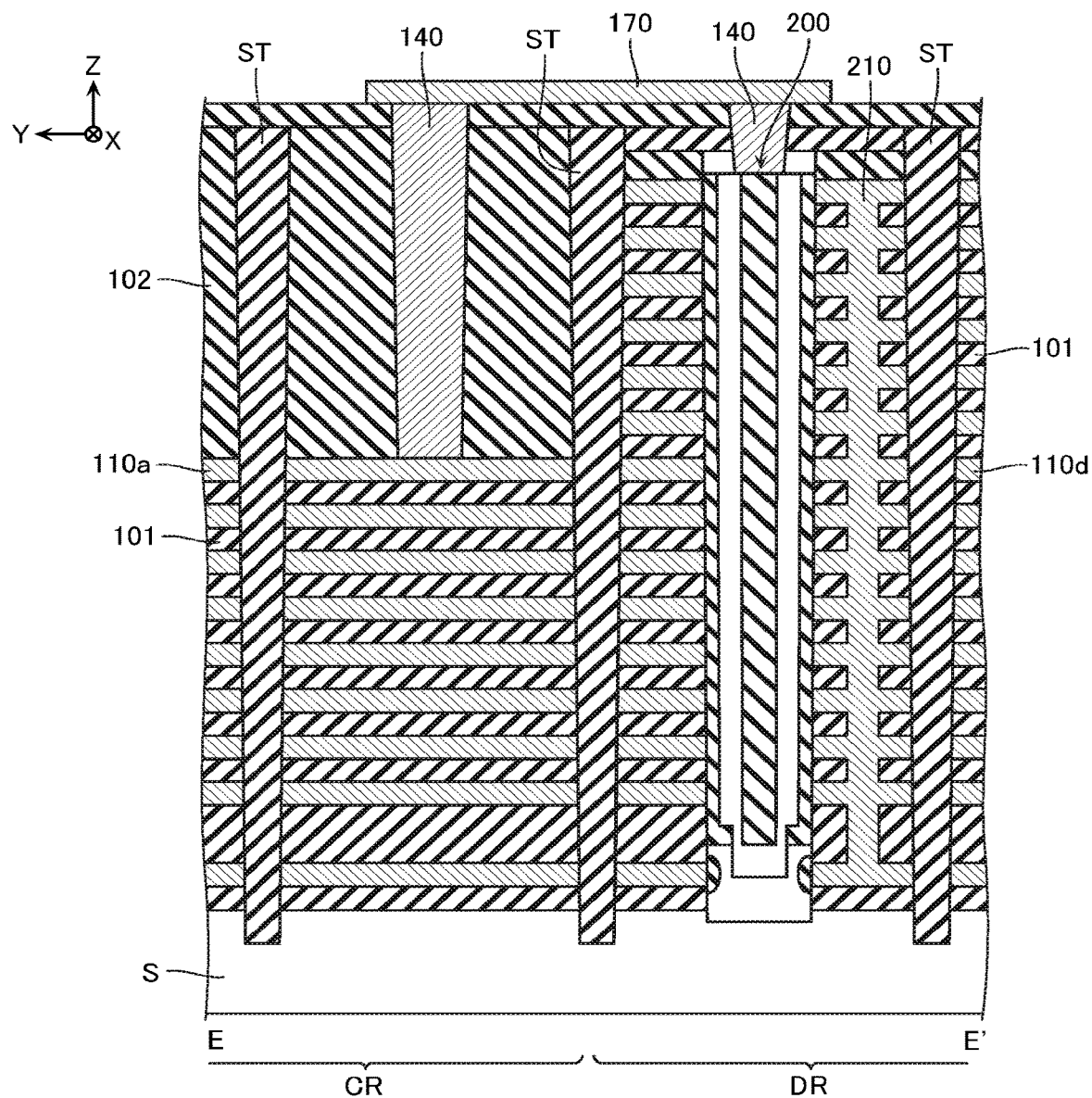
FIG. 8 is a schematic cross-sectional view taken along line E-E' in FIG. 3 and viewed in a direction of an arrow.

FIG. 3 is an enlarged view of a portion indicated by A in FIG. 2, and illustrates a part of the regions MR, CR, and DR. FIG. 4 is a schematic cross-sectional view taken along line B-B' in FIG. 3 and viewed in a direction of an arrow. FIG. 5 is a schematic cross-sectional view taken along line C-C' in FIG. 3 and viewed in a direction of an arrow. FIG. 6 is a schematic perspective view taken along line D-D' in FIG. 3 and viewed in a direction of an arrow. FIG. 7 is an enlarged view of a portion F in FIG. 6. FIG. 8 is a schematic cross-sectional view taken along line E-E' in FIG. 3 and viewed in a direction of an arrow.

As illustrated in FIGS. 4 and 6, the memory cell array MA is provided on the substrate S. The substrate S is, for example, a semiconductor substrate made of single crystal silicon (Si) or the like. The substrate S has, for example, a double well structure having an N-type impurity layer such as phosphorus (P) on the surface of the semiconductor substrate and further having a P-type impurity layer such as boron (B) in the N-type impurity layer.

The memory cell array MA includes a plurality of columnar memory structures 100 which are formed in the memory region MR and extend in the Z direction, and a plurality of plate-shaped conductive layers 110 which cover the outer peripheral surfaces of the plurality of memory structures 100 in the XY cross section and extend, for example, in the XY direction. A stepped contact portion 111 is formed in the contact region CR at an end of the plurality of conductive layers 110 in the X direction. Contacts 140 are connected to the contact portion 111. A plurality of wirings 150, 160, and 170 are connected to the upper end of the memory structure 100 and the upper end of the contact 140.

The memory structures 100 are arranged in a predetermined pattern in the X direction and the Y direction, in the memory region MR. These memory structures 100 basically function as the memory units MU.

As illustrated in FIG. 6, the memory structure 100 includes a semiconductor layer 120 extending in the Z direction, a gate insulating film 130 provided between the semiconductor layer 120 and the conductive layer 110, a semiconductor layer 113 connected between a lower end of the semiconductor layer 120 and the surface of the substrate S, and a semiconductor layer 114 connected to an upper end of the semiconductor layer 120.

The semiconductor layer 120 functions as, for example, a channel region of the plurality of memory cells MC and the drain selection transistor STD included in one memory unit MU (FIG. 1). The semiconductor layer 120 has, for example, a substantially cylindrical shape, and an insulating layer 121 formed of silicon oxide ($SiO_2$) or the like is embedded in a central portion. The semiconductor layer 120 is, for example, a semiconductor layer formed of non-doped polycrystalline silicon (Si) or the like.

The gate insulating film 130 is provided at each intersection between the semiconductor layer 120 and the conductive layer 110. FIG. 7 is an enlarged cross-sectional view of a portion F in FIG. 6. As illustrated in FIG. 7, the gate insulating film 130 includes, for example, a tunnel insulating film 131, a charge storage film 132, and a block insulating film 133 which are stacked between the semiconductor layer 120 and the conductive layer 110. The tunnel insulating film 131 and the block insulating film 133 are, for example, insulating films formed of silicon oxide ($SiO_2$) or the like. The charge storage film 132 constitutes a memory portion, and is a film capable of storing a charge such as silicon nitride (SiN).

The semiconductor layer 113 (FIG. 6) functions as, for example, a channel region of the source selection transistor STS. A gate insulating film 119 is provided on the outer peripheral surface of the semiconductor layer 113. The semiconductor layer 113 is, for example, a semiconductor layer formed of single crystal silicon (Si) or the like. The gate insulating film 119 is, for example, an insulating film formed of silicon oxide or the like.

The semiconductor layer 114 is, formed example, a semiconductor layer formed of polycrystalline silicon (Si) containing an N-type impurity such as phosphorus.

The conductive layers 110 are substantially plate-shaped conductive layers which are arranged in the Z direction through insulating layers 101 such as silicon oxide and extend in the X direction and the Y direction. The plurality of conductive layers 110 are formed over the memory region MR, the contact region CR, and the drive circuit region DR.

As illustrated in FIG. 6, the conductive layer 110 has a plurality of through-holes formed in a predetermined pattern in the memory region MR, and the above-described memory structure 100 is provided in each of the through-holes. In addition, the contact portion 111 formed in the contact region CR at the end of the conductive layers 110 in the X direction is formed in a step-like shape in which the contact portion 111 becomes far from the memory region MR as being closer to the substrate S. The conductive layer 110 includes a stacked film or the like formed of, for example, titanium nitride (TiN) and tungsten (W).

Conductive layers 110a each function as the word line WL (FIG. 1) and gate electrodes of the plurality of memory cells MC (FIG. 1) connected to the word line WL. The conductive layer 110a is commonly connected to all of the memory structures 100 in one memory block MB. An insulating portion ST such as silicon oxide which extends up to the substrate S is provided between the conductive layers 110a of the memory blocks MB adjacent to each other in the Y direction.

Conductive layers 110b provided above the conductive layers 110a function as the drain selection gate line SGD (FIG. 1) and gate electrodes of the plurality of drain selection transistors STD (FIG. 1) connected to the drain selection gate line SGD. The conductive layer 110b is divided into four in the Y direction in the memory block MB, and is commonly connected to all of the memory structures 100 in one string unit SU. An insulating portion SHE such as silicon oxide is provided between the conductive layers 110b adjacent in the Y direction in one memory block MB.

A conductive layer 110c provided below the conductive layers 110a functions as the source selection gate line SGS (FIG. 1) and gate electrodes of the plurality of source selection transistors STS connected to the source selection gate line SGS. The conductive layer 110c covers the outer peripheral surface of the semiconductor layer 113 through the gate insulating film 119. The conductive layer 110c is commonly connected to all of the memory structures 100 in one memory block MB.

The contact 140 extends in the Z direction and is connected to the contact portion 111 of the plurality of conductive layers 110. The contact 140 includes a stacked film or the like formed of, for example, titanium nitride (TiN) and tungsten (W).

The wiring 150 functions as the bit line BL. A plurality of wirings 150 are arranged in the X direction and extend in the Y direction. The wirings 150 are connected to the plurality of memory structures 100 through contacts 151.

As illustrated in FIG. 3, in the plurality of conductive layers 110, a portion where the contact portion 111 of the word line WL and the source selection gate line SGS in one memory block MB is formed has a width in the Y direction which is half of the width of the memory block MB in the Y direction, and is formed at one side of the memory block MB in the Y direction. At the other side of the memory block MB in the Y direction, the drive circuit region DR is provided.

The drive circuit region DR is surrounded by the insulating portion ST extending to the substrate S, and thereby is insulated and separated from the plurality of conductive layers 110a, 110b, and 110c constituting the memory block MB. As illustrated in FIG. 4, in the drive circuit region DR, a plurality of conductive layers 110d are stacked as they are without forming a step-like portion. A plurality of transistor structures 200 are formed to penetrate the conductive layers 110d in the Z direction. The plurality of transistor structures 200 constitute a driving circuit for driving the word line WL and the source selection gate line SGS, and are arranged in the X direction such that the positions in the X direction are the same as the contacts 140 of the word lines WL and the source selection gate lines SGS.

As illustrated in FIG. 4, the transistor structure 200 includes a semiconductor layer 201 extending in the Z direction, a gate insulating film 202 provided between the semiconductor layer 201 and the conductive layer 110d, a semiconductor layer 203 connected between a lower end of the semiconductor layer 201 and the surface of the substrate S, a semiconductor layer 204 connected to an upper end of the semiconductor layer 201, an insulating layer 205 embedded in the central portion of the semiconductor layer 201, and a gate insulating film 206 formed on the outer peripheral surface of the semiconductor layer 203.

The semiconductor layer 201 functions as a channel region of a plurality of drive transistors DTR (block selection transistor 35 in FIG. 1) formed at a position facing the conductive layer 110d. The semiconductor layer 201 has, for example, a substantially cylindrical shape. The semiconductor layer 201 is, for example, a semiconductor layer formed of non-doped polycrystalline silicon (Si) or the like. The insulating layer 205 in the central portion is formed of silicon oxide ($SiO_2$) or the like.

The gate insulating film 202 is provided at each intersection between the semiconductor layer 201 and the conductive layer 110d. The gate insulating film 130 is formed of, for example, silicon oxide ($SiO_2$).

The semiconductor layer 203 functions as a channel region of the drive transistor DTR closest to the substrate S. The semiconductor layer 203 is, for example, a semiconductor layer formed of single crystal silicon (Si) or the like. The gate insulating film 206 provided on the outer peripheral surface of the semiconductor layer 203 is formed of, for example, silicon oxide.

The semiconductor layer 204 is, formed example, a semiconductor layer formed of polycrystalline silicon (Si) containing an N-type impurity such as phosphorus. The contacts 140 are connected to the semiconductor layer 204 from above.

As illustrated in FIGS. 3 and 8, in the drive circuit region DR, a plate-like gate contact 210 which penetrates the plurality of conductive layers 110d in the Z direction, is commonly connected to the conductive layers 110d, and extends in the Z direction, is provided at a position separated from the transistor structure 200.

Further, as illustrated in FIG. 5, in the contact region CR, the plurality of conductive layers 110b forming the drain selection gate line SGD are commonly connected through the contact 140 and the wiring 160. Further, the contacts 140 connected to the plurality of conductive layers 110a and 110c forming the word line WL and the source selection gate line SGS are connected to the contacts 140 connected to the transistor structure 200, which are adjacent thereto in the Y direction, through the wiring 170 extending in the Y direction.

In the semiconductor memory device of the present embodiment configured as described above, the transistor structure 200 constitutes a plurality of drive transistors DTR having a vertical TFT structure connected in series. Further, the plurality of conductive layers 110d function as gates of the transistor structure 200. Therefore, when a predetermined gate voltage is applied to the commonly connected conductive layers 110d, the drive transistors DTR connected in series are turned on, the word line WL is connected to the circuit on the substrate S, and the word line WL is driven.

[Manufacturing Method]

Next, a method of manufacturing the semiconductor memory device according to the present embodiment will be described with reference to FIGS. 9 to 21.

Figure 9:
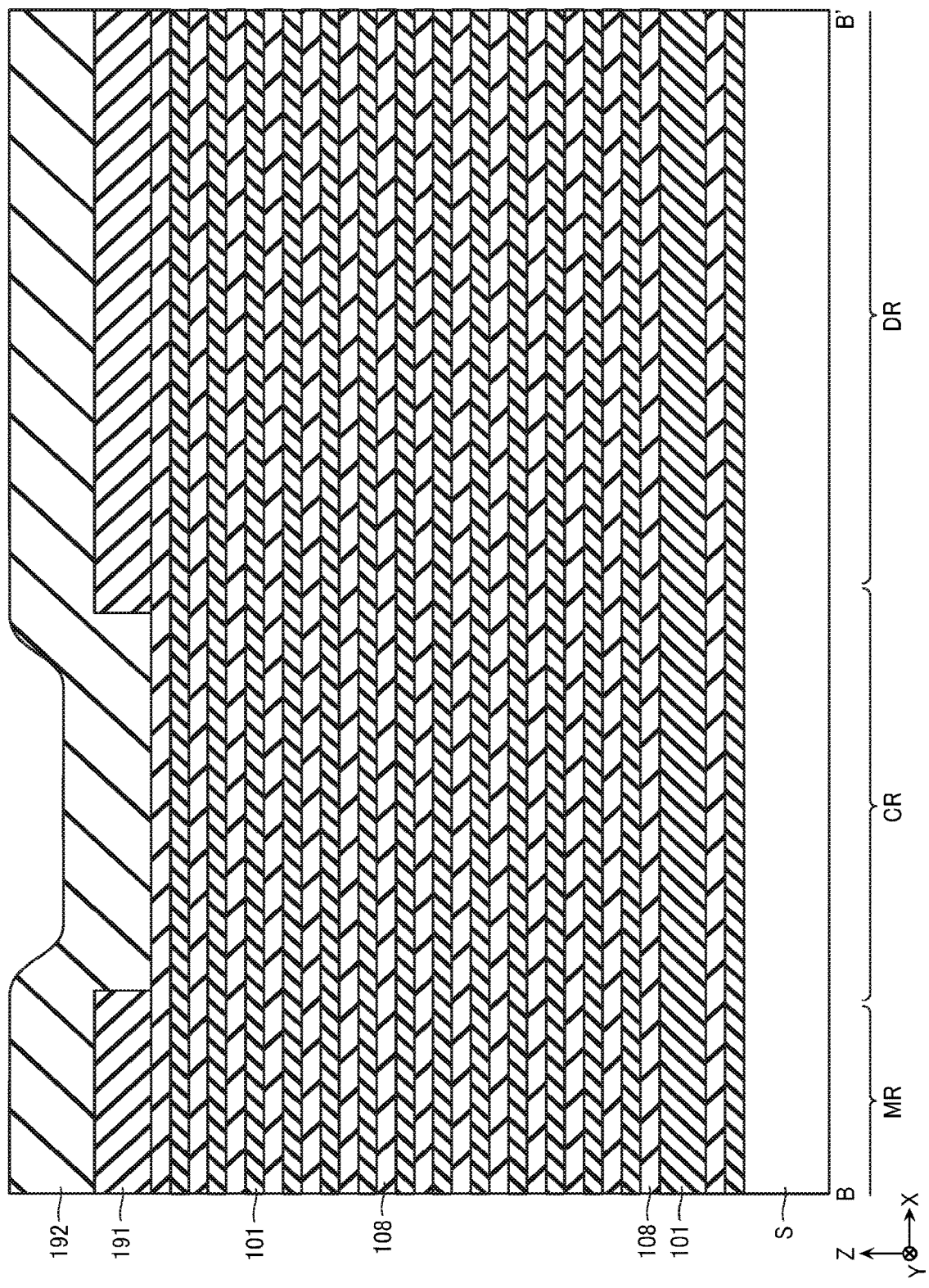
FIG. 9 is a schematic cross-sectional view illustrating a manufacturing step of the semiconductor memory device.
Figure 10A:
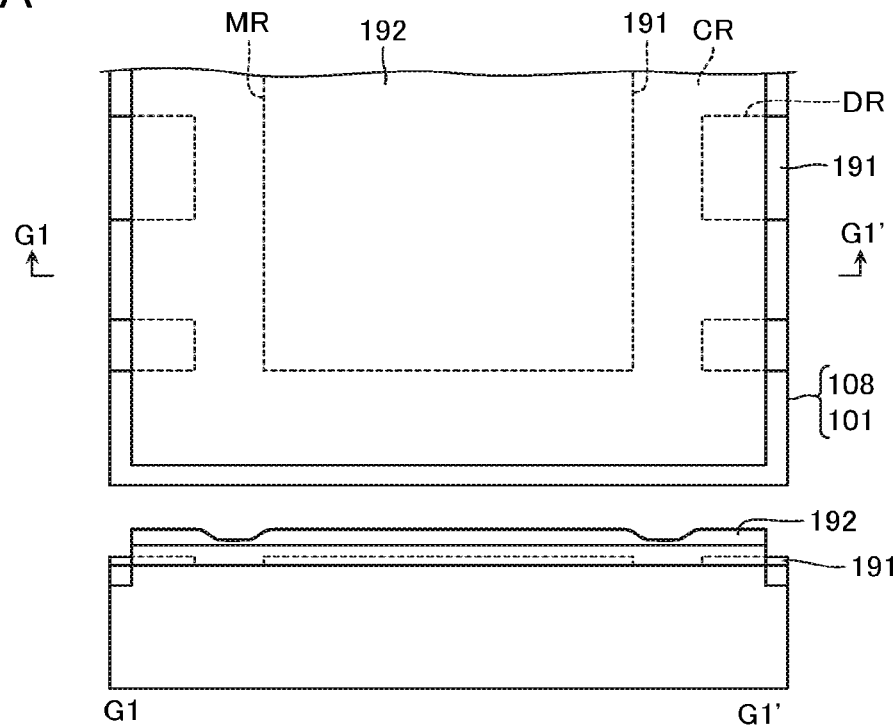
FIGS. 10A, 10B, 10C, and 10D are schematic plan views and cross-sectional views illustrating a manufacturing step of the semiconductor memory device.
Figure 10B:
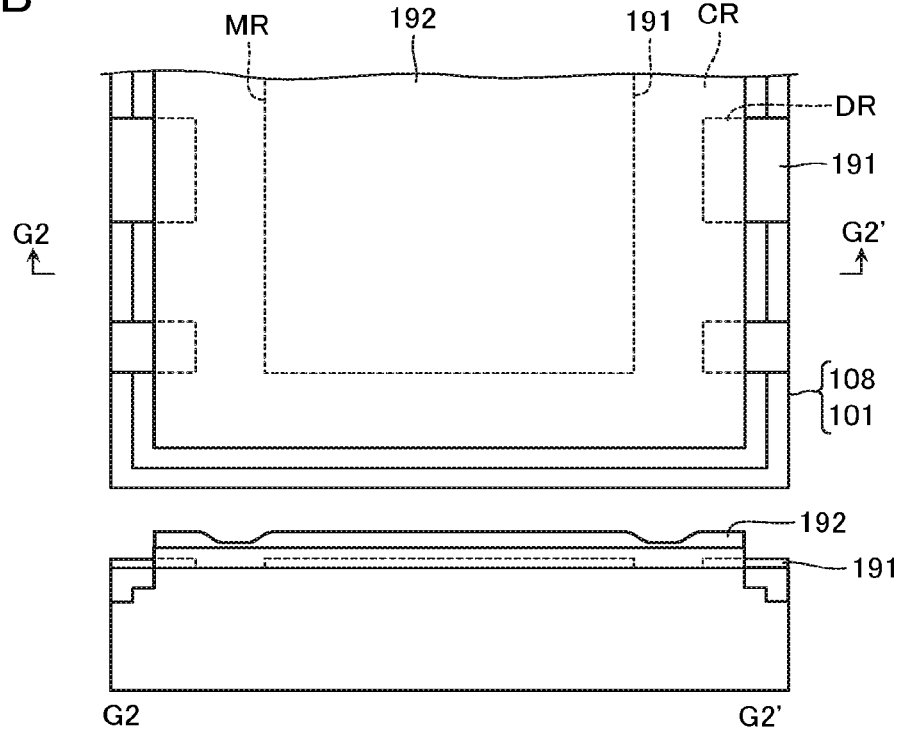
Figure 10C:
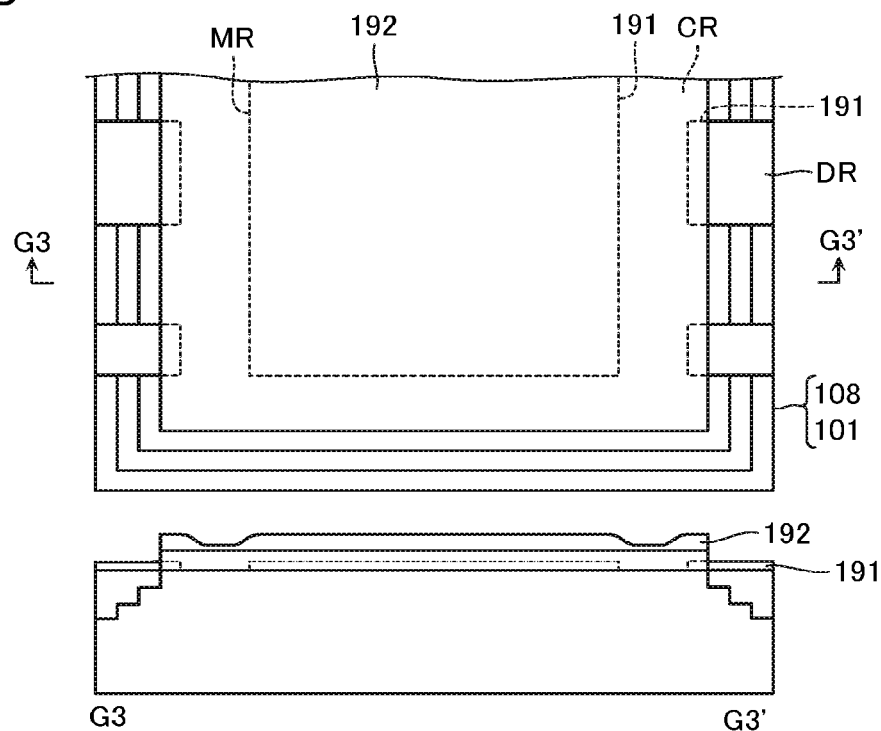
Figure 10D:
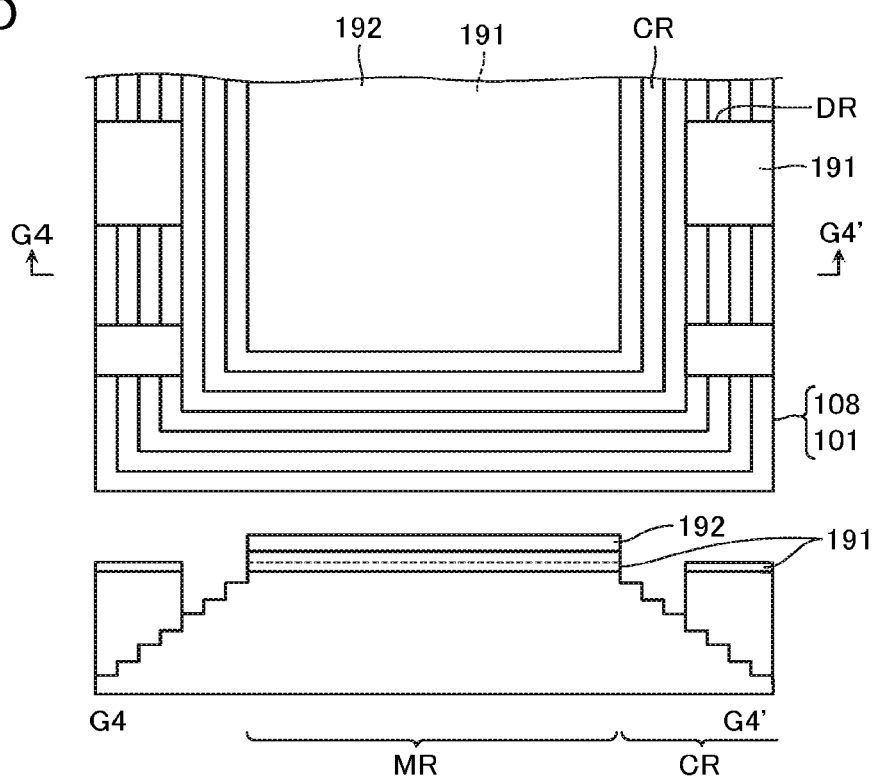

As illustrated in FIG. 9, a plurality of insulating layers 101 and a plurality of sacrificial layers 108 are alternately stacked on the substrate S in the Z direction. The insulating layer 101 is made of, for example, silicon oxide ($SiO_2$). The sacrificial layer 108 is made of, for example, silicon nitride (SiN). This step is performed by, for example, a method such as chemical vapor deposition (CVD).

Next, as illustrated in FIG. 9, a hard mask 191 is formed on a portion to be the memory region MR and a portion to be the drive circuit region DR in the stacked body including the insulating layers 101 and the sacrificial layers 108, and then, a resist 192 is entirely formed thereon.

Subsequently, as illustrated in FIGS. 10A to 10D, the stacked body is etched while the resist 192 is successively slimmed to form a step portion around the stacked body. The step of etching the stacked body is performed by, for example, a method such as reactive ion etching (RIE) or wet etching. At this time, no step portion is formed in the drive circuit region DR covered with the hard mask 191 and all of the insulating layers 101 and the sacrificial layers 108 remain.

Figure 11:
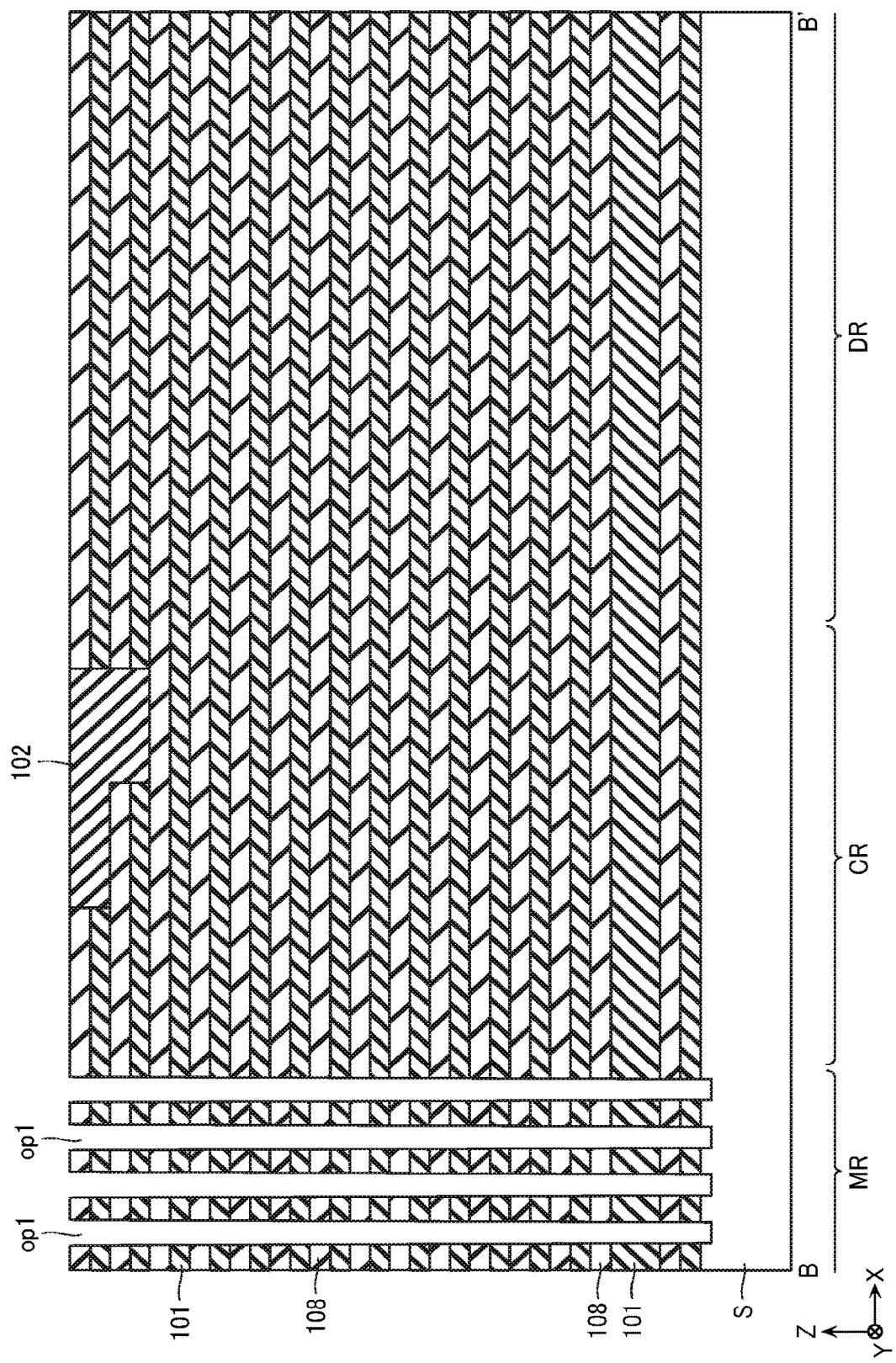
FIG. 11 is a schematic cross-sectional view illustrating a manufacturing step of the semiconductor memory device.

Next, as illustrated in FIG. 11, an insulating layer 102 is formed in the removed portion of the stacked body. Next, a plurality of openings op1 for forming the memory structures 100 are formed in the memory region MR of the stacked body. The opening op1 is a hole which extends in the Z direction, penetrates the insulating layers 101 and the sacrificial layers 108, and exposes the upper surface of the substrate S. This step is performed by a method such as RIE.

Figure 12:
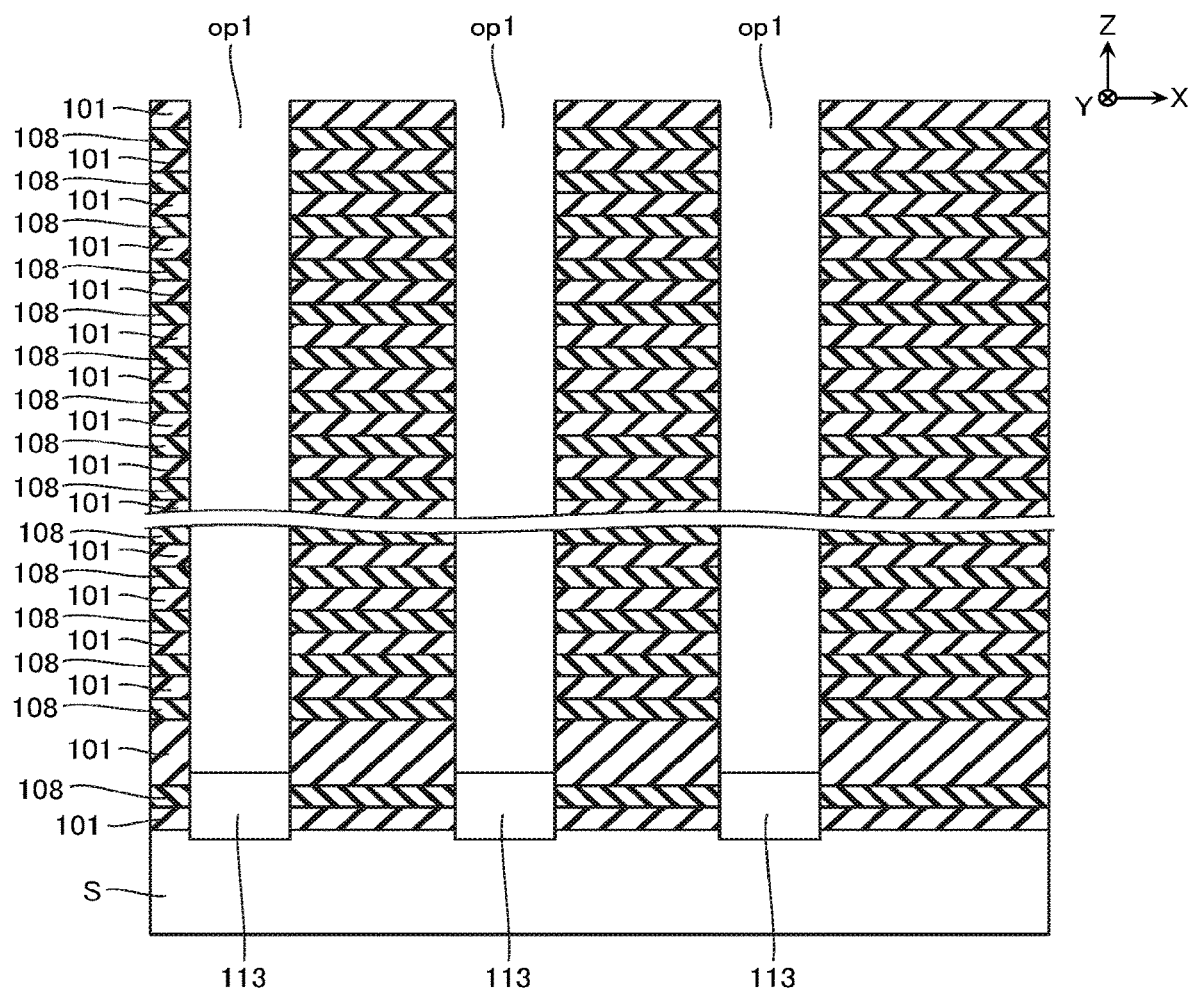
FIG. 12 is a schematic cross-sectional view illustrating a manufacturing step of the semiconductor memory device.

Next, as illustrated in FIG. 12, the semiconductor layer 113 is formed on the bottom surface of the opening op1. This step is performed by, for example, a method such as epitaxial growth.

Figure 13:
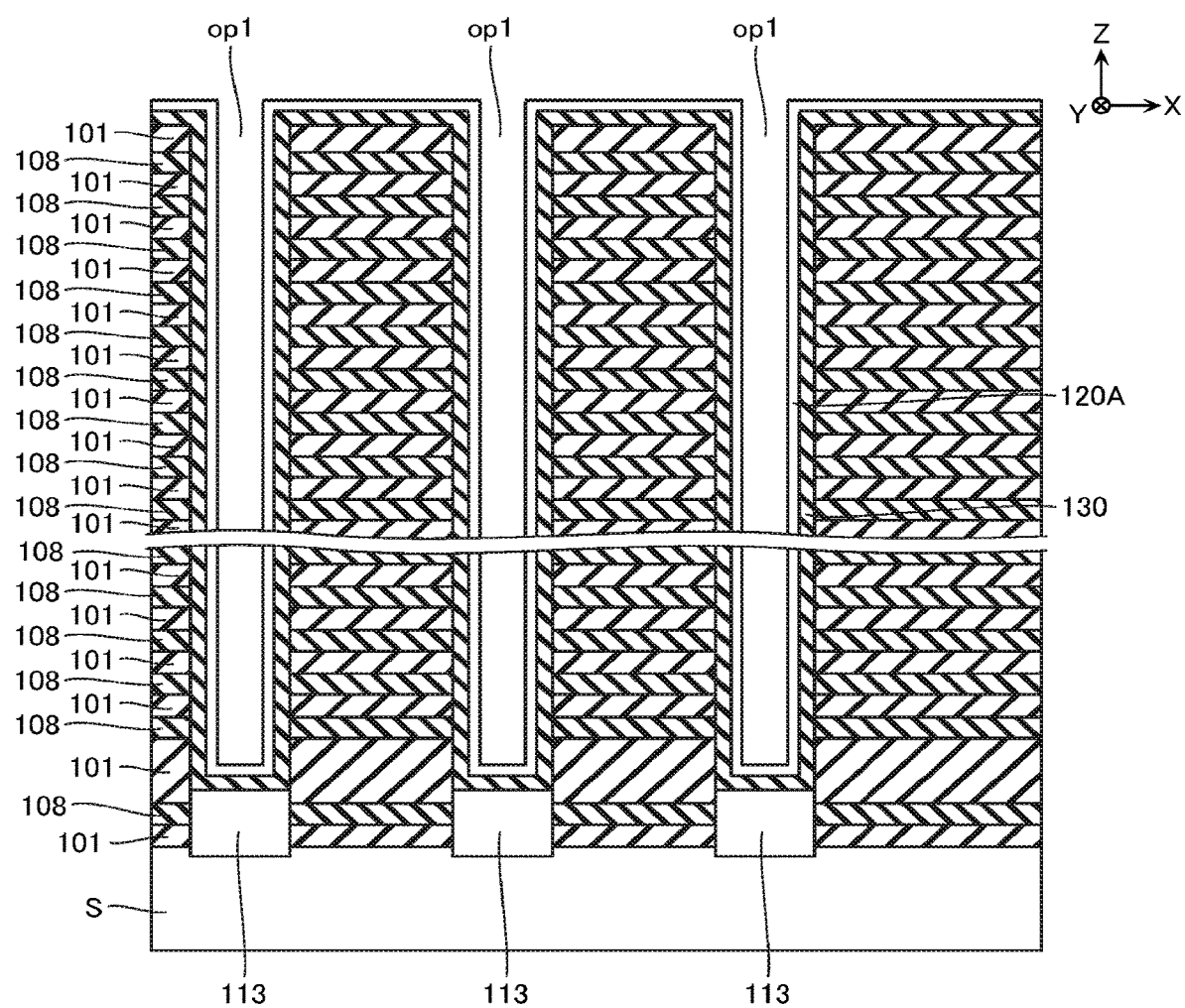
FIG. 13 is a schematic cross-sectional view illustrating a manufacturing step of the semiconductor memory device.

Next, as illustrated in FIG. 13, the gate insulating film 130 and an amorphous silicon layer 120A are formed on the upper surface of the semiconductor layer 113 and the inner peripheral surface of the opening op1. This step is performed by, for example, a method such as CVD.

Figure 14:
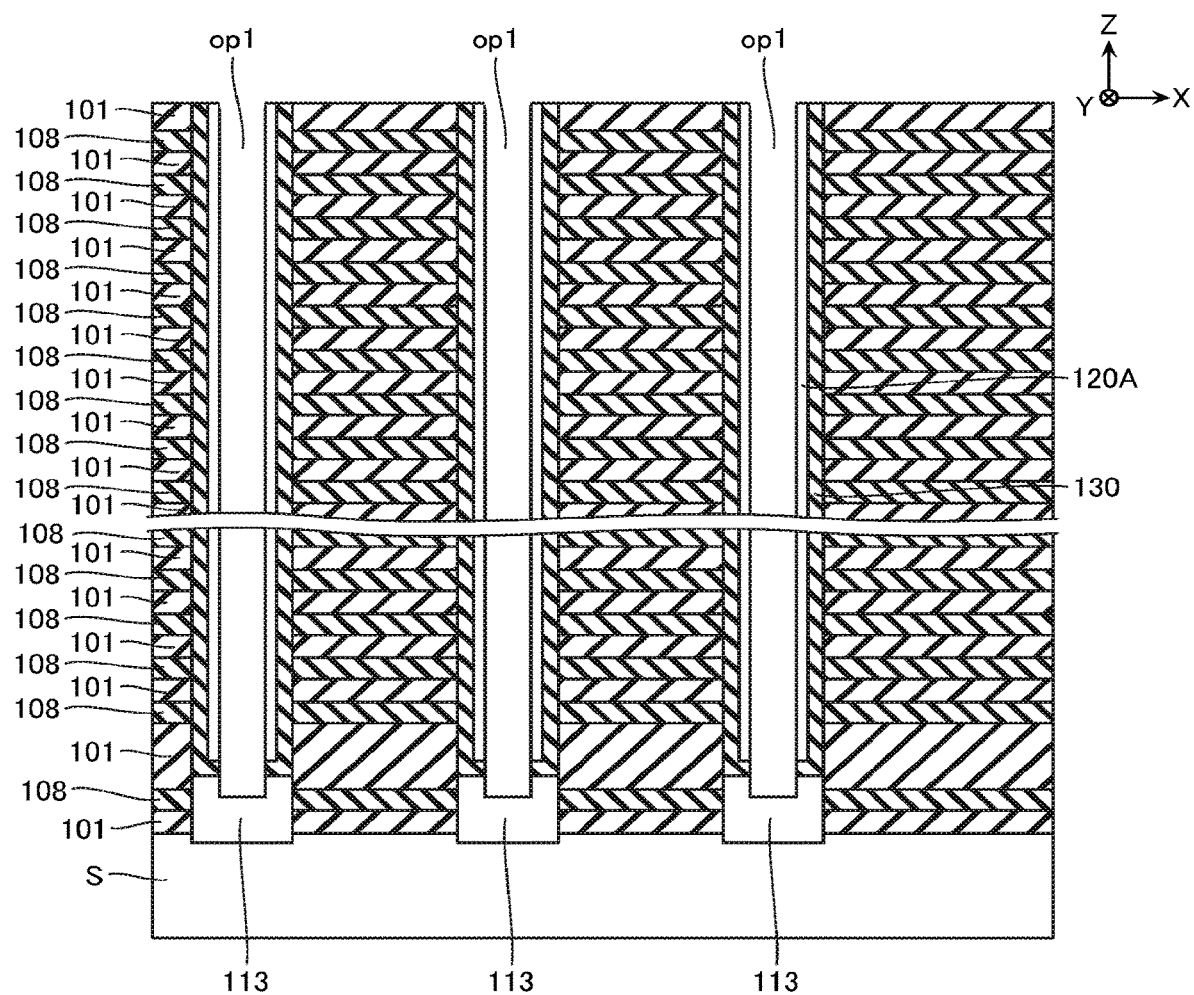
FIG. 14 is a schematic cross-sectional view illustrating a manufacturing step of the semiconductor memory device.

Next, as illustrated in FIG. 14, portions of the gate insulating film 130 and the amorphous silicon layer 120A which cover the upper surface of the semiconductor layer 113 are removed. This step is performed by a method such as RIE.

Figure 15:
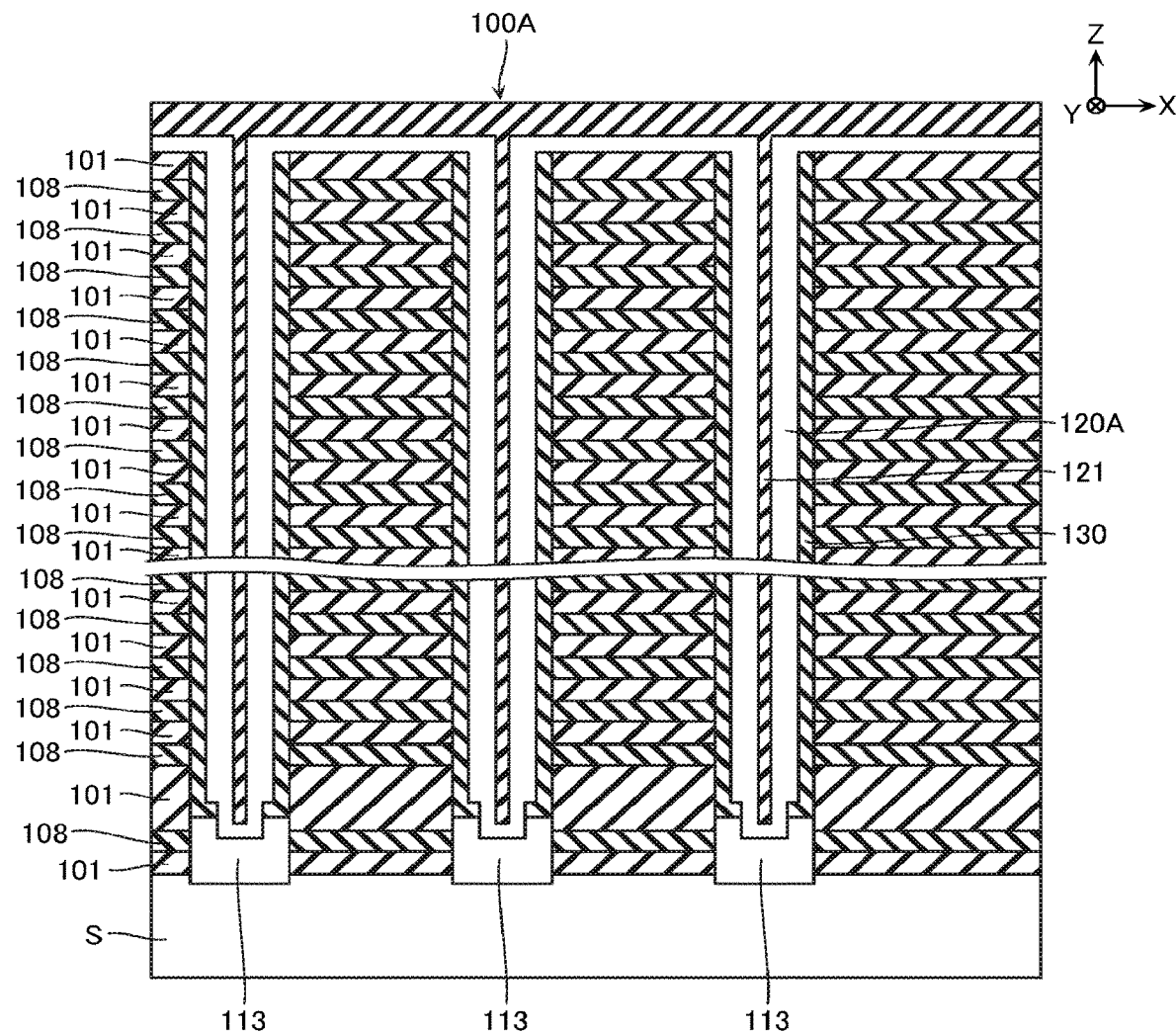
FIG. 15 is a schematic cross-sectional view illustrating a manufacturing step of the semiconductor memory device.

Next, as illustrated in FIG. 15, the amorphous silicon layer 120A and the insulating layer 121 are formed on the upper surface of the semiconductor layer 113 and the inner peripheral surface of the amorphous silicon layer 120A. This step is performed by, for example, a method such as CVD. After that, the semiconductor layer 120 is formed by modifying the crystal structure of the amorphous silicon layer 120A by annealing or the like. As a result, the memory structure 100A in the intermediate step is formed.

Figure 16:
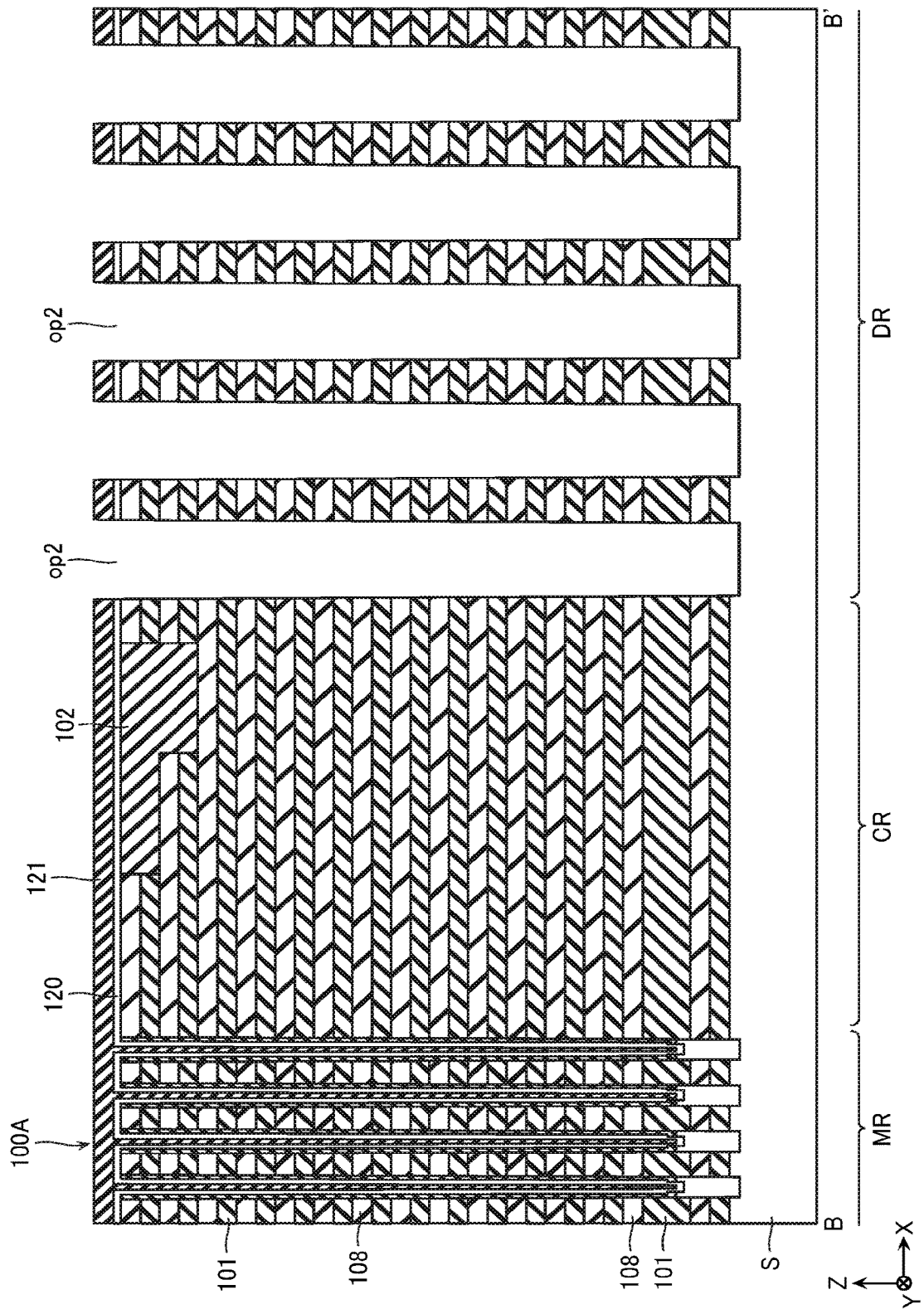
FIG. 16 is a schematic cross-sectional view illustrating a manufacturing step of the semiconductor memory device.

Next, as illustrated in FIG. 16, a plurality of openings op2 for forming the transistor structures 200 are formed in the drive circuit region DR of the stacked body. The opening op2 has a larger diameter than the opening op1, extends in the Z direction, penetrates the insulating layers 101 and the sacrificial layers 108, and exposes the upper surface of the substrate S. This step is performed by a method such as RIE.

Figure 17:
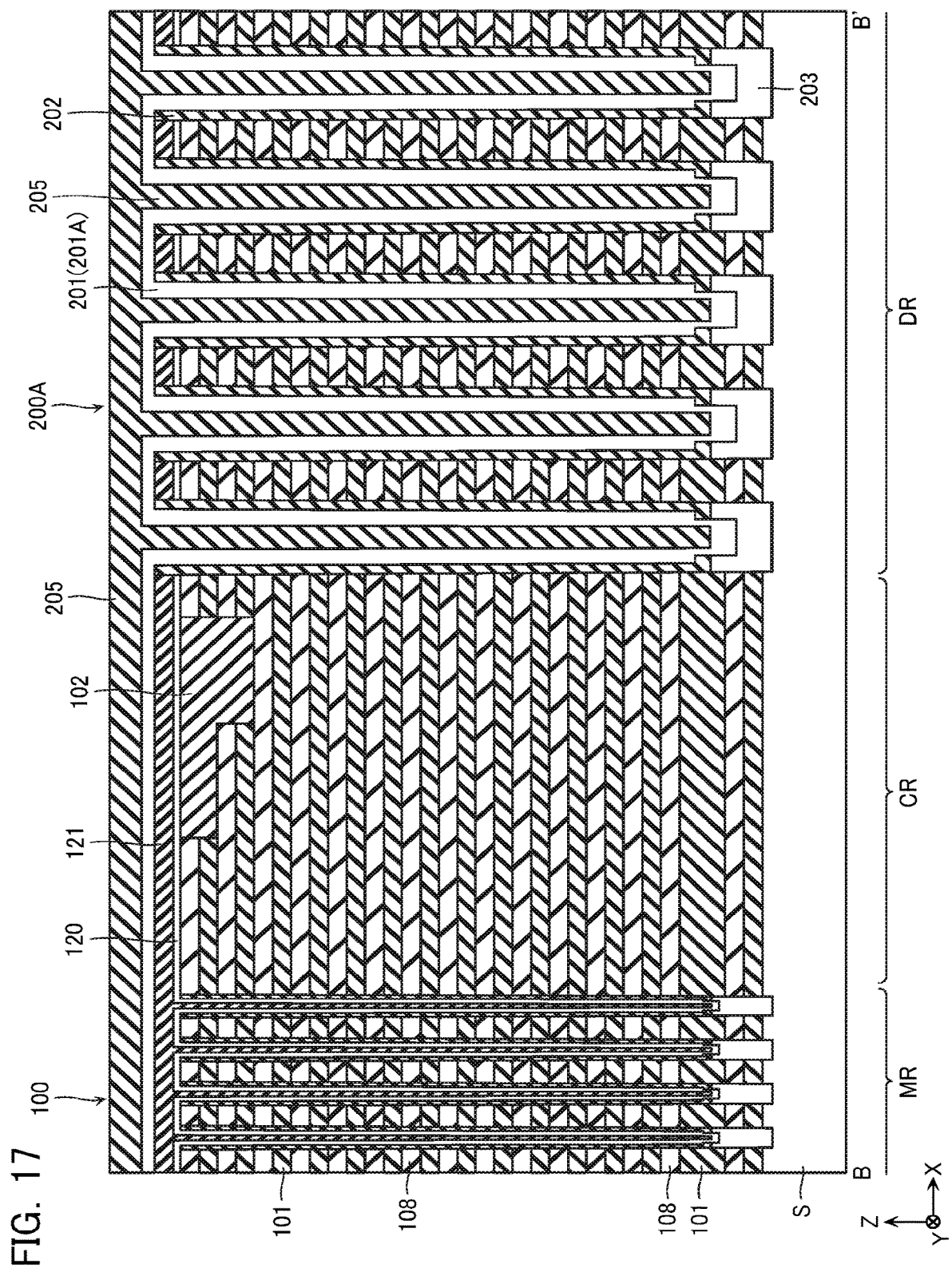
FIG. 17 is a schematic cross-sectional view illustrating a manufacturing step of the semiconductor memory device.

Next, as illustrated in FIG. 17, a transistor structure 200A is formed in substantially the same procedure as that for the memory structure 100A. More specifically, (1) the semiconductor layer 203 is formed on the bottom surface of the opening op2 by, for example, a method such as epitaxial growth. (2) The gate insulating film 202 and an amorphous silicon layer 201A are formed on the upper surface of the semiconductor layer 203 and the inner peripheral surface of the opening op2 by, for example, a method such as CVD. (3) Portions of the gate insulating film 202 and the amorphous silicon layer 201A which cover the upper surface of the semiconductor layer 203 are removed by, for example, a method such as RIE. (4) An amorphous silicon layer and the insulating layer 205 are formed on the inner peripheral surface of the amorphous silicon layer 201A by CVD or the like. (5) The semiconductor layer 201 is formed by modifying the crystal structure of the amorphous silicon layer 201A by annealing or the like. Thus, the transistor structure 200A is formed.

Figure 18:
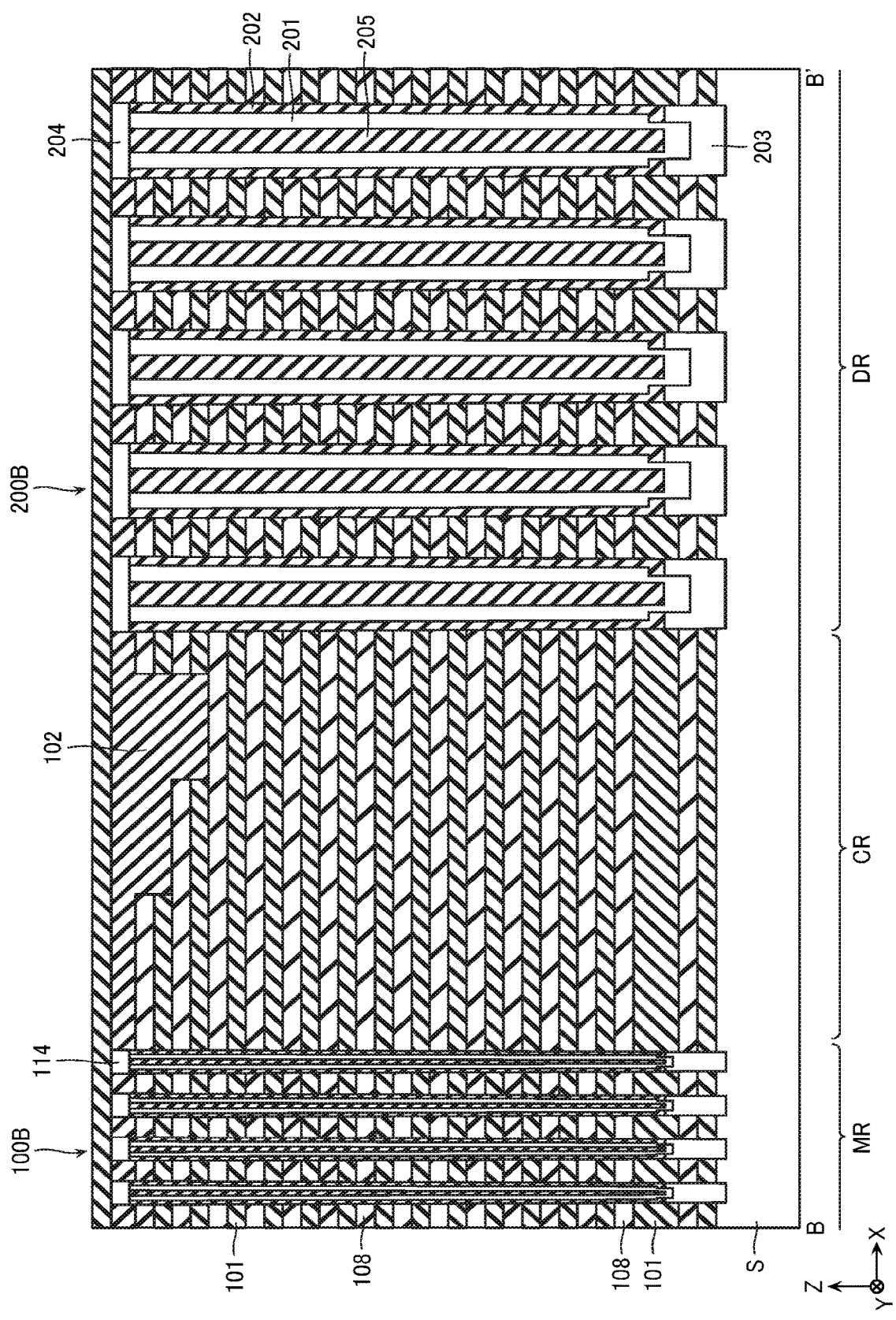
FIG. 18 is a schematic cross-sectional view illustrating a manufacturing step of the semiconductor memory device.

Next, as illustrated in FIG. 18, portions of the semiconductor layer 120, the insulating layer 121, the semiconductor layer 201, the insulating layer 205, and the gate insulating film 202 are removed to expose the uppermost insulating layer 101. Further, the semiconductor layers 114 and 204 are formed near the upper ends of the openings op1 and opt, respectively. Thus, a memory structure 100B and a transistor structure 200B which have a substantially columnar shape are formed. This step is performed by a method such as RIE and CVD.

Figure 19:
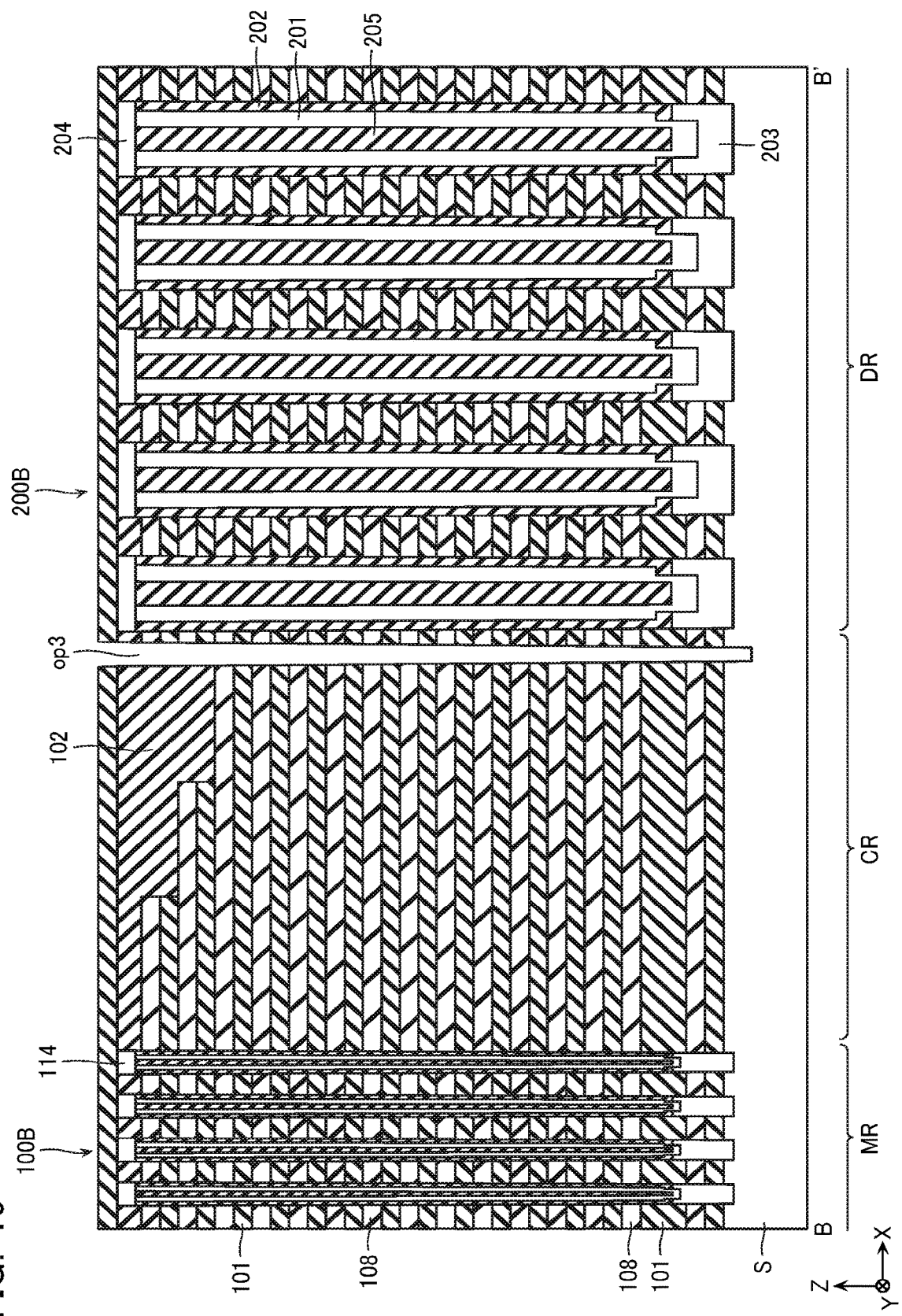
FIG. 19 is a schematic cross-sectional view illustrating a manufacturing step of the semiconductor memory device.

Next, as illustrated in FIG. 19, an opening op3 is formed. The opening op3 is a groove that extends in the Z direction, the Y direction, and the X direction, divides the insulating layers 101 and the sacrificial layers 108 in the X direction and the Y direction, and exposes the upper surface of the substrate S. This step is performed by a method such as RIE.

Figure 20:
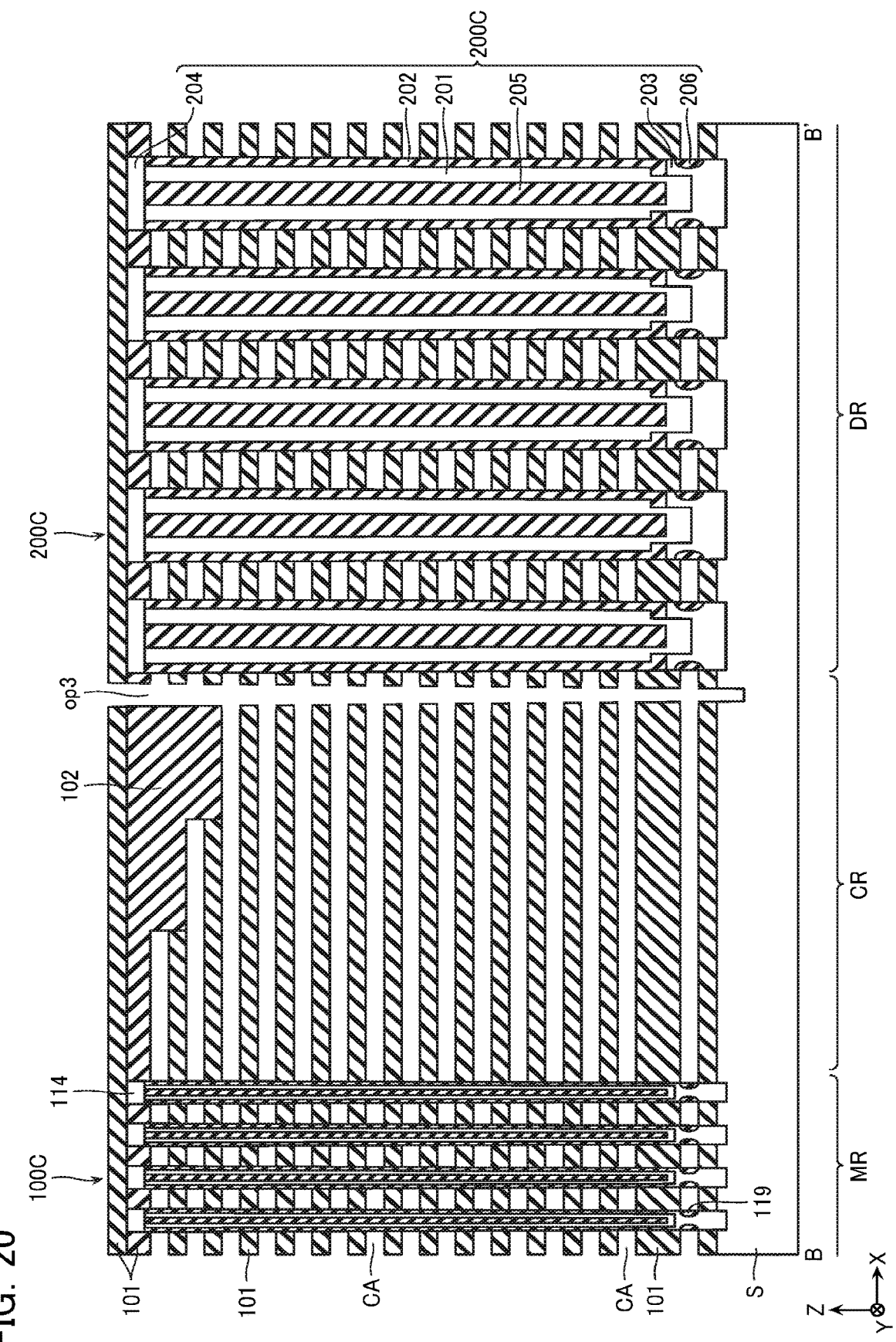
FIG. 20 is a schematic cross-sectional view illustrating a manufacturing step of the semiconductor memory device.

Next, as illustrated in FIG. 20, the plurality of sacrificial layers 108 are removed through the openings op3 to form cavities CA. This step is performed by, for example, wet etching. At this time, the memory structure 100B and the transistor structure 200B support the plurality of insulating layers 101 arranged in the Z direction.

Next, gate insulating films 119 and 206 are formed. The formation of the gate insulating films 119 and 206 is performed by, for example, a method such as an oxidation treatment through the cavity CA. Thus, a memory structure 100C and a transistor structure 200C are formed.

Figure 21:
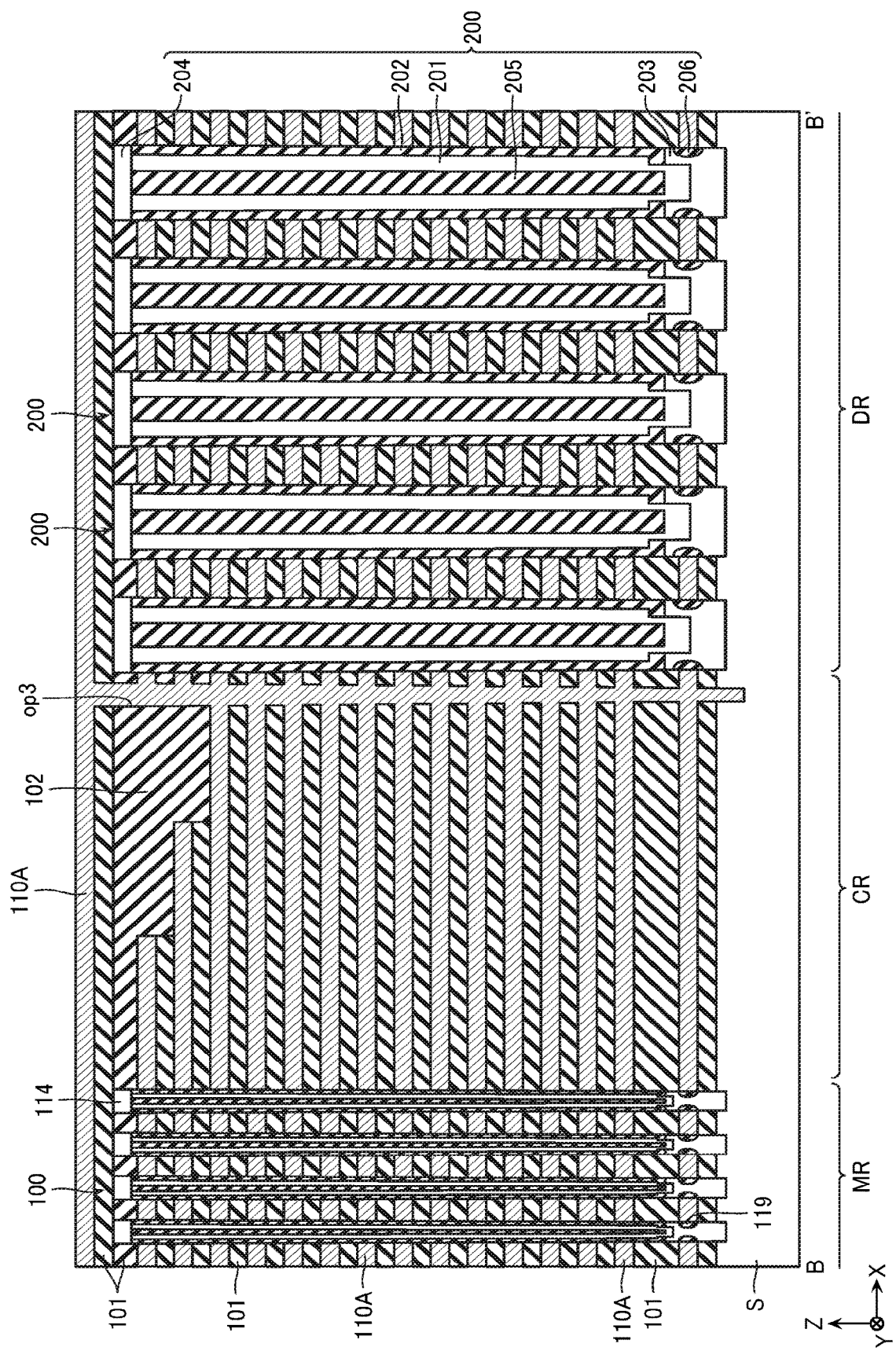
FIG. 21 is a schematic cross-sectional view illustrating a manufacturing step of the semiconductor memory device.

Next, as illustrated in FIG. 21, a conductive layer 110A is embedded in the cavity CA through the opening op3. The formation of the conductive layer 110A is performed by, for example, a method such as CVD. Thus, the memory structure 100 and the transistor structure 200 are formed. Although not illustrated, the gate contact 210 can be formed simultaneously with the formation of the conductive layer 110A by adding a step of forming a groove that penetrates the stacked body in the Z direction after the stacking of the sacrificial layers 108 and forming a sacrificial layer with the same material as the sacrificial layer 108, or a step of forming a groove for forming the gate contact 210 simultaneously with the formation of the opening op3.

Then, the conductive layer 110A remaining in the opening op3 and above the stacked structure is removed, the insulating portion ST is formed in the opening op3, and the contacts 140 and 151 and the wirings 150, 160, and 170 are formed, thereby manufacturing the semiconductor memory device illustrated in FIG. 4.

Effects of Embodiment

With the semiconductor memory device according to the present embodiment, the drive transistor DTR of the word line WL is disposed adjacent to the contact portion 111 so as to enter a part of the contact portion 111 of the word line WL. Therefore, it is not necessary to dispose the drive transistor DTR having a large area, in the region of the peripheral circuit PC, and thus it is possible to reduce the chip area.

The transistor structure 200 of the drive transistor DTR forms a vertical TFT penetrating the plurality of conductive layers 110d in the Z direction, and thus it is possible to secure a sufficient gate length and a sufficient gate width with a small occupied area.

According to the present embodiment, the plurality of conductive layers 110d forming the gate of the transistor structure 200 of the drive transistor DTR are formed simultaneously with the conductive layers 110a, 110b, and 110c which constitute the word lines WL and the selection gate lines SGD and SGS. Further, the memory structure 100 and the transistor structure 200 can be manufactured by a similar process. Thus, the manufacturing process can be simplified.

Second Embodiment

Figure 22:
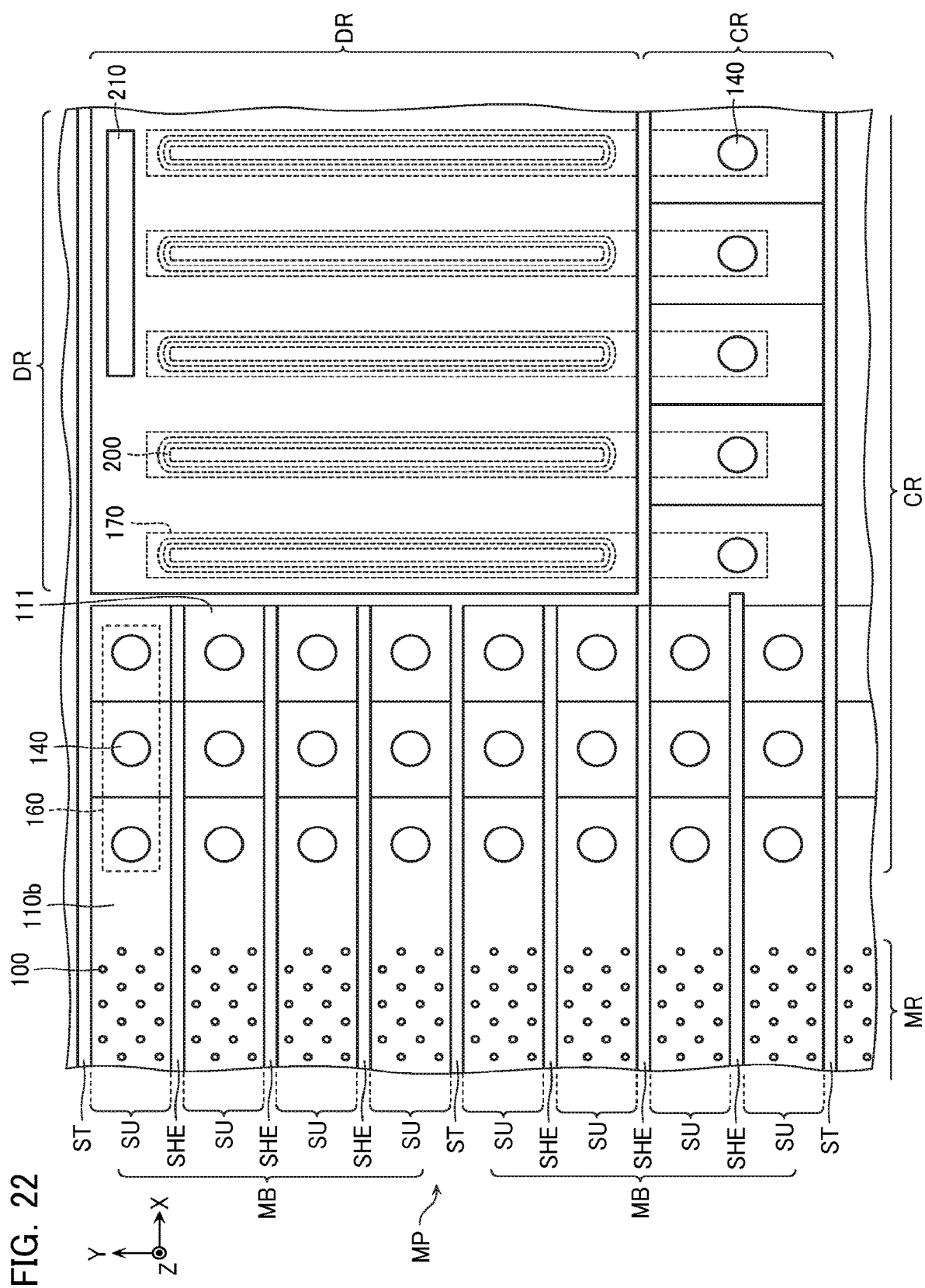
FIG. 22 is a schematic plan view illustrating a part of a semiconductor memory device according to a second embodiment.
Figure 23:
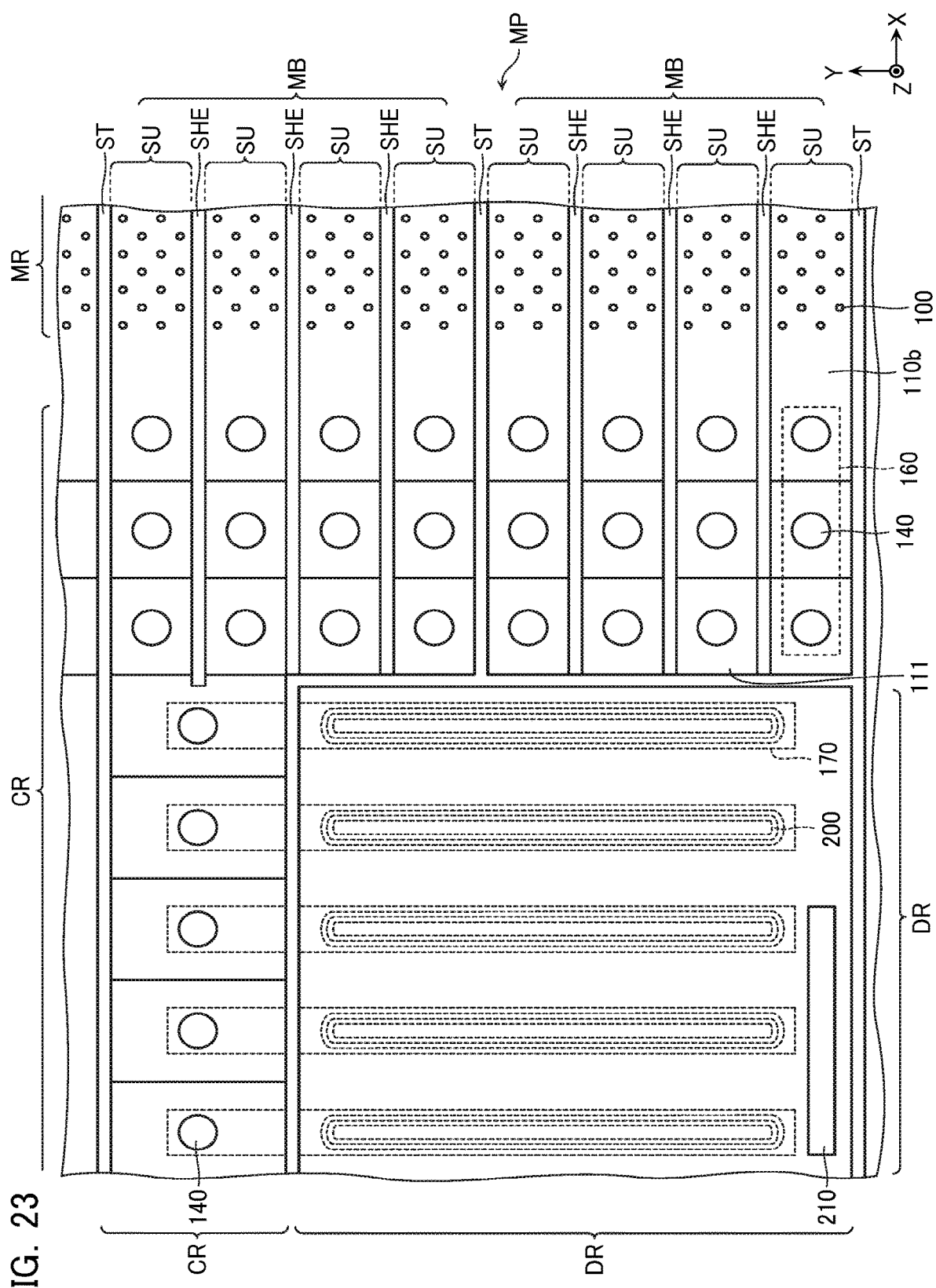
FIG. 23 is a schematic plan view illustrating a part of the semiconductor memory device.

FIGS. 22 and 23 are enlarged plan views illustrating a part of a semiconductor memory device according to a second embodiment.

In the first embodiment, one drive circuit region DR is formed in each memory block MB to have a width in the Y direction corresponding to two string units SU. On the other hand, in the second embodiment, one drive circuit region DR is formed in every two memory blocks MB by extending over the two memory blocks MB, to have a width in the Y direction corresponding to six string units SU. Other configurations are the same as those of the first embodiment.

The transistor structures 200 disposed in the drive circuit region DR illustrated in FIG. 22 are disposed on the right side of the memory region MR in the X direction, and drive the lower memory block MB of the two memory blocks MB in the drawing. On the other hand, the transistor structures 200 disposed in the drive circuit region DR illustrated in FIG. 23 are disposed on the left side of the memory region MR in the X direction, and drive the upper memory block MB of the two memory blocks MB in the drawing.

The transistor structure 200 of the present embodiment can have a longer length in the Y direction than the transistor structure 200 of the first embodiment. Thus, the channel width of the drive transistor DTR can be made longer than that of the drive transistor DTR of the first embodiment, so that the on-current can be made larger than that of the first embodiment.

Third Embodiment

Figure 24:
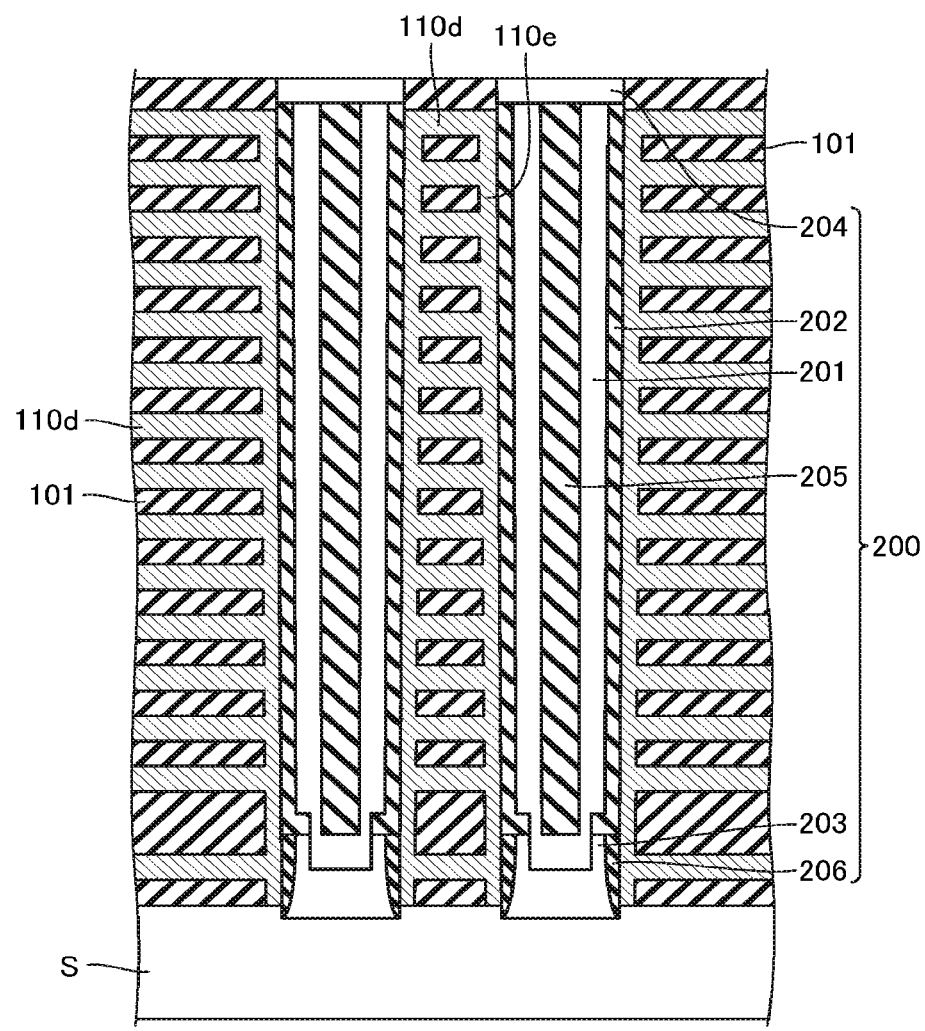
FIG. 24 is a schematic cross-sectional view illustrating a part of a semiconductor memory device according to a third embodiment.

FIG. 24 is a schematic cross-sectional view illustrating the configuration of a semiconductor memory device according to a third embodiment.

In the first embodiment, the portions of the plurality of conductive layers 110d facing the transistor structure 200 are divided in the Z direction. On the other hand, in the third embodiment, portions of the plurality of conductive layers 110d facing the transistor structure 200 are connected in the Z direction by a conductive layer 110e. Other configurations are the same as those of the first embodiment.

According to the present embodiment, since the gate power is not divided in the Z direction with respect to the channel of the semiconductor layer 201 extending in the Z direction, it is possible to improve the driving force of the transistor structure 200 as compared with the first embodiment.

Figure 25:
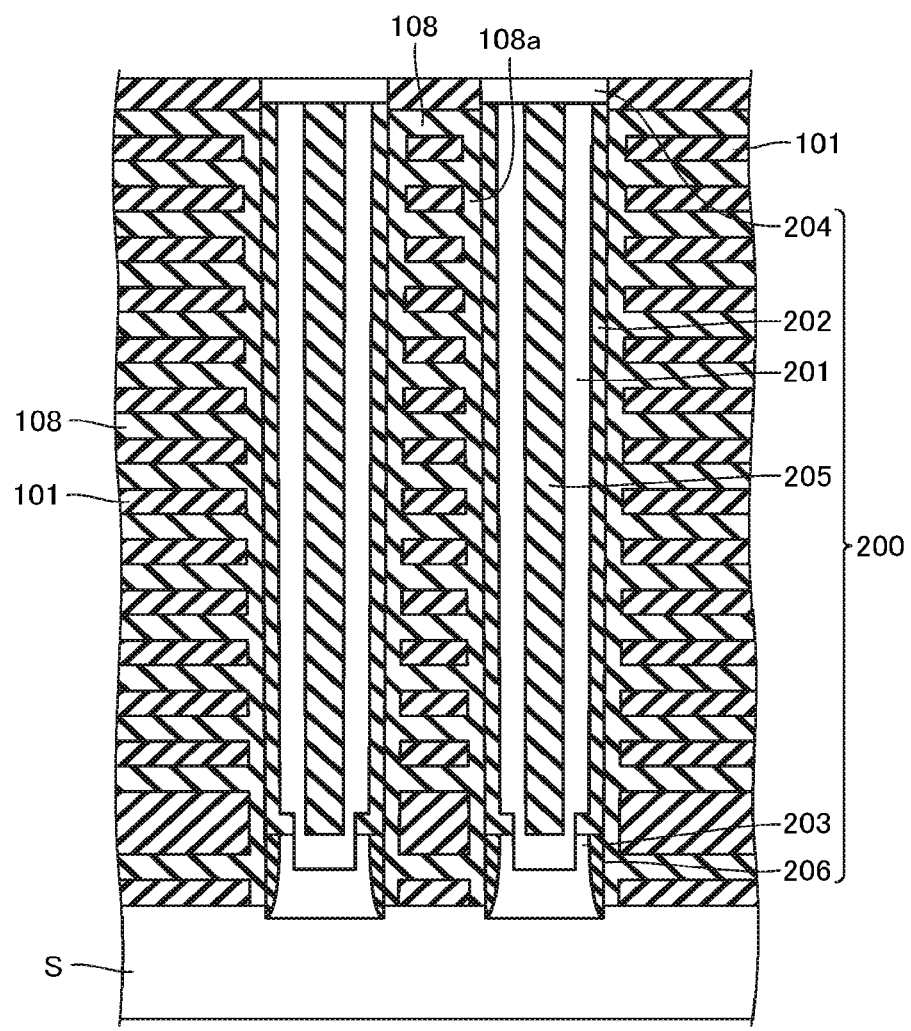
FIG. 25 is a schematic cross-sectional view illustrating a manufacturing step of the semiconductor memory device.

In order to manufacture the semiconductor memory device of the present embodiment, as illustrated in FIG. 25, a sacrificial layer 108a extending in the Z direction is additionally formed at a portion of the sacrificial layer 108 for forming the conductive layer 110d, which is in contact with the transistor structure 200, and then, the sacrificial layer 108a may be replaced with the conductive layer 110e. Note that the gate insulating film 206 is formed larger than in the first embodiment such that the conductive layer 110e and the semiconductor layer 203 are not in direct contact with each other.

Fourth Embodiment

Figure 26:
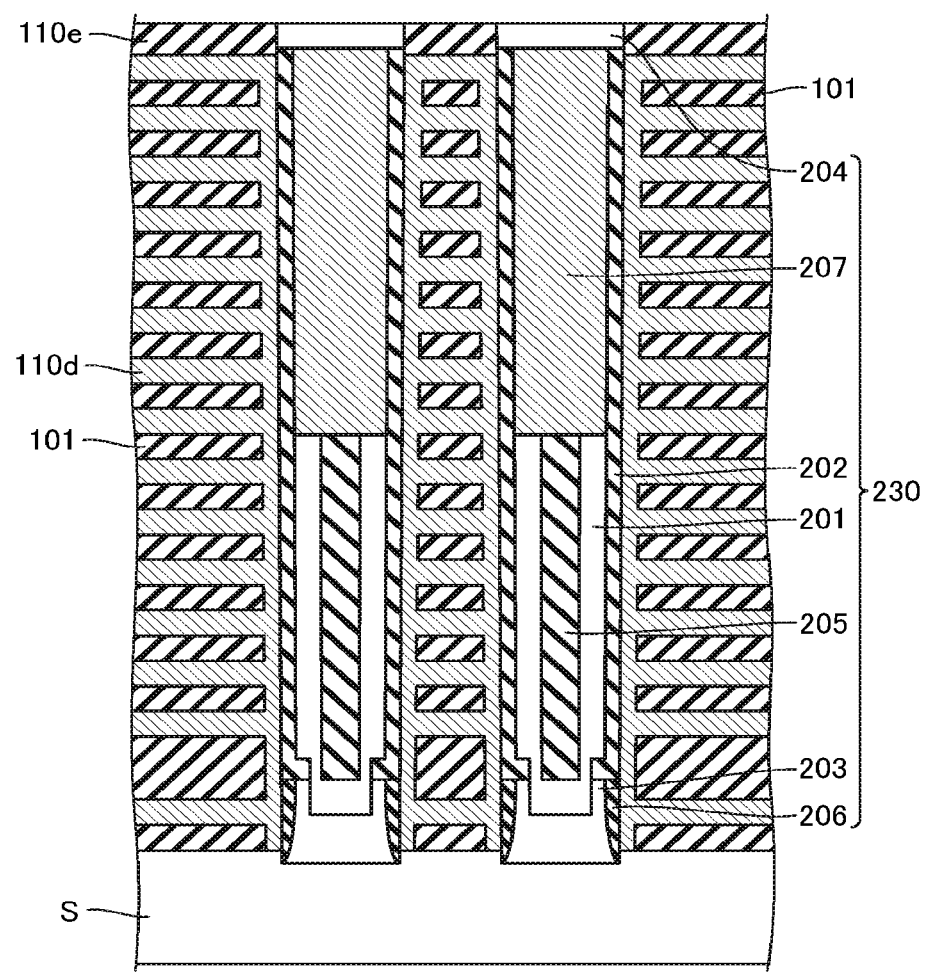
FIG. 26 is a schematic cross-sectional view illustrating a part of a semiconductor memory device according to a fourth embodiment.

FIG. 26 is a schematic cross-sectional view illustrating the configuration of a semiconductor memory device according to a fourth embodiment.

In the first embodiment, the semiconductor layer 201 of the transistor structure 200 forms a vertical TFT extending in the Z direction from the uppermost layer to the lowermost layer of the stacked structure including the plurality of conductive layers 110d. On the other hand, in the fourth embodiment, a conductive contact 207 is embedded in the upper layer portion of a transistor structure 230. Other configurations are the same as those of the third embodiment.

According to the present embodiment, by adjusting the length of the contact 207 in the Z direction, it is possible to adjust the substantial height of the transistor structure 230, more specifically, the channel length of the drive transistor DTR to an appropriate value.

Fifth Embodiment

Figure 27:
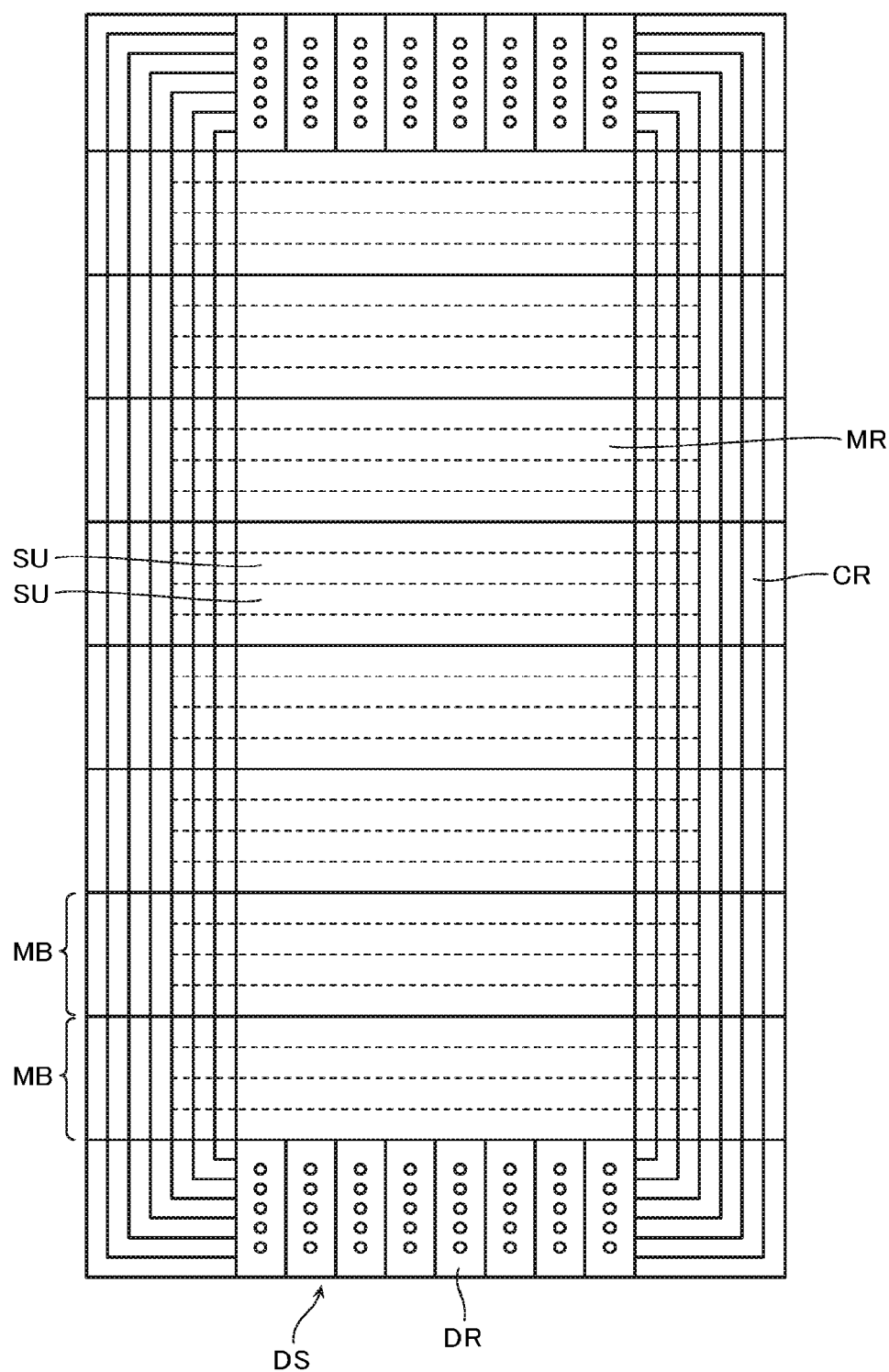
FIG. 27 is a schematic plan view illustrating a part of a semiconductor memory device according to a fifth embodiment.

FIG. 27 is a schematic plan view illustrating a part of a semiconductor memory device according to a fifth embodiment.

In the first embodiment, the drive circuit regions DR are formed on both sides of the memory region MR in the X direction so as to enter a part of the contact region CR. On the other hand, in the fifth embodiment, the drive circuit regions DR are provided in the dummy step portions DS on both sides of the memory region MR in the Y direction. For the dummy step portion DS, it is possible to prevent the formation of the step portion using a hard mask at the time of forming the step portion of the contact region CR.

In the present embodiment, it is possible to obtain the same effects as in the above-described embodiments by forming a wiring pattern connecting the contact region CR and the drive circuit region DR in the upper wiring layer.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a plurality of conductive layers which are disposed in a first direction intersecting the substrate and extend in a second direction intersecting the first direction;
   a first semiconductor layer which extends in the first direction and faces the plurality of conductive layers;
   a memory portion which is provided between the first semiconductor layer and the plurality of conductive layers; and
   a drive circuit which drives the memory cell,
   wherein the plurality of conductive layers are provided in a first region where a plurality of the memory cells are disposed,
   a second region provided closer to an end portion of the plurality of conductive layers than the first region in the second direction, and
   a third region different from the first region and the second region,
   a portion positioned in the third region of the plurality of conductive layers is insulated from portions positioned in the first region and the second region of the plurality of conductive layers,
   the drive circuit is provided in the third region, and includes
   a second semiconductor layer which extends through the plurality of conductive layers in the first direction, and
   an insulating layer provided between the second semiconductor layer and the plurality of conductive layers, and
   one end of the second semiconductor layer is connected to the plurality of conductive layers in the second region through a wiring and the other end of the second semiconductor layer is connected to the substrate.

2. The semiconductor memory device according to claim 1,
   wherein the third region is provided at a position adjacent to the second region in a third direction intersecting the first direction and the second direction, and
   the wiring that connects the one end of the second semiconductor layer to the plurality of conductive layers in the second region extends in the third direction.

3. The semiconductor memory device according to claim 1,
   wherein the third region is provided at a position adjacent to the first region in a third direction intersecting the first direction and the second direction.

4. The semiconductor memory device according to claim 1,
   wherein portions of the plurality of conductive layers in the third region are connected in the first direction.

5. The semiconductor memory device according to claim 1,
   wherein the second region includes a stepped contact portion which includes end portions of the plurality of conductive layers in the second direction become far from the first region as being closer to the substrate, and a contact of which one end is connected to the contact portion and the other end is farther from the substrate than the one end, and the one end of the second semiconductor layer is connected to the other end of the contact through the wiring.

6. A semiconductor memory device comprising:
a substrate;
a plurality of conductive layers which are disposed in a first direction intersecting the substrate and extend in a second direction intersecting the first direction;
a first structure which extends in the first direction and faces the plurality of conductive layers; and
a second structure which extends in the first direction and faces the plurality of conductive layers,
wherein the plurality of conductive layers include
a first region where the first structure is disposed,
a second region provided closer to an end portion of the plurality of conductive layers than the first region in the second direction, and
a third region which is insulated from the first region and the second region and where the second structure is disposed,
the first structure includes
a first semiconductor layer which extends in the first direction and faces the plurality of conductive layers,
a memory portion which is provided between the first semiconductor layer and the plurality of conductive layers,
the second structure includes
a second semiconductor layer which extends in the first direction and faces the plurality of conductive layers, and
an insulating layer provided between the second semiconductor layer and the plurality of conductive layers, and
one end of the second structure is connected to the plurality of conductive layers in the second region through a wiring and the other end of the second structure is connected to a circuit formed on the substrate.

7. The semiconductor memory device according to claim 6,
wherein the plurality of conductive layers are separated in a third direction intersecting the first direction and the second direction, by a plurality of insulating portions each extending in the first direction and the second direction, and
the first structure and the first and second regions of the plurality of separated conductive layers are parts of a memory block.

8. The semiconductor memory device according to claim 7,
wherein the third region of the plurality of conductive layers is provided to correspond to the memory block and is disposed to align with the second region of the corresponding memory block in the third direction.

9. The semiconductor memory device according to claim 8,
a sum of widths of the second region and the third region of the memory block in the third direction is substantially equal to a width of the first region of the corresponding memory block in the third direction.

10. The semiconductor memory device according to claim 9,
wherein a width of the second region of the memory block in the third direction is substantially equal to a width of the third region of the corresponding memory block in the third direction.

11. The semiconductor memory device according to claim 7, further comprising
a first memory block and a second memory block which are adjacent to each other in the third direction,
wherein the second region and the third region of the plurality of conductive layers corresponding to the first memory block are provided to align in the third direction on one side of the first memory block and the second memory block in the third direction, and
the second region and the third region of the plurality of conductive layers corresponding to the second memory block are provided to align in the third direction on the other side of the first memory block and the second memory block in the third direction.

12. The semiconductor memory device according to claim 11,
a sum of widths of the second region and the third region corresponding to each of the first memory block and the second memory block in the third direction is substantially equal to a sum of widths of the first region of the first memory block and the first region of the second memory block in the third direction.

13. The semiconductor memory device according to claim 12,
wherein a width of the third region corresponding to each memory block in the third direction is greater than a width of the second region of the corresponding memory block in the third direction.

14. The semiconductor memory device according to claim 7,
wherein positions of end portions of the plurality of conductive layers positioned in the second region in the second direction are different.

15. The semiconductor memory device according to claim 14, further comprising:
a plurality of the second structures,
wherein the plurality of second structures are arranged in the second direction to correspond to the positions of the end portions of the plurality of conductive layers in the second region in the second direction.

16. The semiconductor memory device according to claim 15,
wherein the wiring that connects the one end of the second structure to the plurality of conductive layers in the second region extends in the third direction.

17. A method of manufacturing a semiconductor memory device, the method comprising:
forming a stacked body by alternately stacking, in a first direction intersecting a surface of a substrate, a plurality of sacrificial layers and a plurality of first insulating layers which extend in a second direction intersecting the first direction;
among a first region, a second region, and a third region of the stacked body, forming a step portion in the second region, the second region being positioned closer to an end portion of the stacked body than the first region in the second direction, the third region being different from the first region and the second region;

forming, in the first region, a memory portion and a first semiconductor layer extending in the first direction and facing the plurality of sacrificial layers and the plurality of first insulating layers;

forming, in the third region, a second insulating layer and a second semiconductor layer extending in the first direction and facing the plurality of sacrificial layers and the plurality of first insulating layers;

forming a groove which separates the third region from the first region and the second region and extends in the first direction;

forming a cavity by removing the sacrificial layers through the groove;

forming a conductive layer in the cavity; and forming a third insulating layer in the groove to insulate the third region from the first region and the second region.

18. The method of manufacturing a semiconductor memory device according to claim 17, wherein the groove is formed to separate the second region and the third region from each other in a third direction intersecting the first direction and the second direction.

19. The method of manufacturing a semiconductor memory device according to claim 18, wherein the step portion is formed such that a position of an end portion of the conductive layer in the second direction matches a position of the second semiconductor layer in the second direction.

20. The method of manufacturing a semiconductor memory device according to claim 19, further comprising:

forming a wiring that connects the end portion of the conductive layer to one end of the second semiconductor layer.

* * * * *